US011159751B2

(12) United States Patent
Tanaka et al.

(10) Patent No.: US 11,159,751 B2
(45) Date of Patent: Oct. 26, 2021

(54) SOLID-STATE IMAGE PICKUP ELEMENT, IMAGE PICKUP DEVICE, AND METHOD OF MANUFACTURING SOLID-STATE IMAGE PICKUP ELEMENT

(71) Applicant: SONY SEMICONDUCTOR SOLUTIONS CORPORATION, Kanagawa (JP)

(72) Inventors: Harumi Tanaka, Kanagawa (JP); Itaru Oshiyama, Kanagawa (JP); Sozo Yokogawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/236,933

(22) Filed: Dec. 31, 2018

(65) Prior Publication Data
US 2019/0158766 A1 May 23, 2019

Related U.S. Application Data

(63) Continuation of application No. 15/778,994, filed as application No. PCT/JP2016/081806 on Oct. 27, 2016, now Pat. No. 10,715,751.

(30) Foreign Application Priority Data

Dec. 11, 2015 (JP) ................................. 2015-242261

(51) Int. Cl.
*H04N 5/341* (2011.01)
*G02B 1/118* (2015.01)
(Continued)

(52) U.S. Cl.
CPC ............. *H04N 5/341* (2013.01); *G02B 1/118* (2013.01); *G02B 5/20* (2013.01); *G02B 5/26* (2013.01);
(Continued)

(58) Field of Classification Search
CPC .... H04N 5/341; H04N 5/2253; H04N 5/2254; H04N 5/23229; H04N 5/2354;
(Continued)

(56) References Cited

U.S. PATENT DOCUMENTS 5,252,509 A 10/1993 Hosack
9,653,507 B2 5/2017 Chou et al.
(Continued)

FOREIGN PATENT DOCUMENTS

CN 101582436 A 11/2009
CN 101689557 A 3/2010
(Continued)

OTHER PUBLICATIONS

Non-Final Rejection for U.S. Appl. No. 15/778,994, dated Oct. 4, 2018, 13 pages.
(Continued)

*Primary Examiner* — Antoinette T Spinks
(74) *Attorney, Agent, or Firm* — Chip Law Group

(57) ABSTRACT

Provided is a solid-state image pickup element that includes a pixel, a light-receiving-surface-sided trench, and a light-receiving-surface-sided shielding member. A plurality of protrusions is formed on the light-receiving surface of the pixel in the solid-state image pickup element. In addition, the light-receiving-surface-sided trench is formed around the pixel having the plurality of protrusions formed, at the light-receiving surface in the solid-state image pickup element. In addition, the light-receiving-surface-sided member is buried in the light-receiving-surface-sided trench formed around the pixel having the plurality of protrusions formed on the light-receiving surface in the solid-state image pickup element. In addition, the photoelectric conversion region of a near-infrared-light pixel expands to the surface side opposed to the light-receiving surface of the photoelectric
(Continued)

conversion region of a visible-light pixel. In addition, a trench is further formed inside the pixel at a surface opposed to the light-receiving surface.

15 Claims, 45 Drawing Sheets

(51) Int. Cl.
*G02B 5/20* (2006.01)
*G02B 5/26* (2006.01)
*H01L 31/10* (2006.01)
*H04N 5/369* (2011.01)
*H01L 27/146* (2006.01)
*H04N 5/232* (2006.01)
*H04N 5/225* (2006.01)
*H04N 5/235* (2006.01)
*H04N 5/33* (2006.01)

(52) U.S. Cl.
CPC ...... *H01L 27/1461* (2013.01); *H01L 27/1462* (2013.01); *H01L 27/1463* (2013.01); *H01L 27/14603* (2013.01); *H01L 27/14621* (2013.01); *H01L 27/14623* (2013.01); *H01L 27/14645* (2013.01); *H01L 27/14649* (2013.01); *H01L 31/10* (2013.01); *H04N 5/2253* (2013.01); *H04N 5/2254* (2013.01); *H04N 5/232* (2013.01); *H04N 5/2354* (2013.01); *H04N 5/23229* (2013.01); *H04N 5/33* (2013.01); *H04N 5/369* (2013.01); *H01L 27/1464* (2013.01); *H01L 27/14641* (2013.01); *H01L 27/14685* (2013.01); *H01L 27/14689* (2013.01)

(58) Field of Classification Search
CPC .......... H04N 5/33; H04N 5/369; H04N 5/232; G02B 1/118; G02B 5/20; G02B 5/26; H01L 27/14603; H01L 27/1461; H01L 27/1462; H01L 27/14621; H01L 27/14623; H01L 27/1463; H01L 27/14645; H01L 27/14649; H01L 27/1464; H01L 27/14641; H01L 27/14685; H01L 27/14689
See application file for complete search history.

(56) References Cited

U.S. PATENT DOCUMENTS

| | | | |
|---|---|---|---|
| 2005/0094277 A1 | 5/2005 | Khusnatdinov | |
| 2008/0087800 A1 | 4/2008 | Toda | |
| 2009/0147101 A1 | 6/2009 | Tatani et al. | |
| 2009/0284630 A1 | 11/2009 | Itonaga | |
| 2009/0321786 A1* | 12/2009 | Cheng | H01L 27/14645 257/187 |
| 2009/0325337 A1* | 12/2009 | Cheng | H01L 27/14689 438/70 |
| 2010/0220228 A1* | 9/2010 | Otake | H04N 9/045 348/311 |
| 2011/0116078 A1 | 5/2011 | Cho et al. | |
| 2012/0120294 A1 | 5/2012 | Nishikido et al. | |
| 2012/0313205 A1 | 12/2012 | Haddad et al. | |
| 2014/0203390 A1 | 7/2014 | Nishikido et al. | |
| 2015/0002718 A1* | 1/2015 | Nomura | H04N 5/37213 348/311 |
| 2015/0084144 A1* | 3/2015 | Suzuki | H01L 27/14627 257/432 |
| 2015/0187826 A1 | 7/2015 | Suzuki | |
| 2015/0244951 A1* | 8/2015 | Oishi | H01L 27/14603 348/243 |
| 2015/0295005 A1 | 10/2015 | Tseng et al. | |
| 2015/0340391 A1 | 11/2015 | Webster et al. | |
| 2016/0112614 A1 | 4/2016 | Masuda et al. | |
| 2017/0062498 A1 | 3/2017 | Suzuki | |
| 2017/0078539 A1 | 3/2017 | Madurawe et al. | |
| 2017/0141151 A1 | 5/2017 | Sato | |
| 2018/0026060 A1 | 1/2018 | Suzuki | |
| 2018/0027157 A1 | 1/2018 | Masuda et al. | |
| 2018/0047766 A1 | 2/2018 | Pyo et al. | |
| 2018/0182793 A1 | 6/2018 | Inui et al. | |
| 2018/0324339 A1 | 11/2018 | Masuda et al. | |

FOREIGN PATENT DOCUMENTS

| | | |
|---|---|---|
| CN | 102468315 A | 5/2012 |
| CN | 104488082 A | 4/2015 |
| CN | 105229790 A | 1/2016 |
| CN | 106463517 A | 2/2017 |
| CN | 107104117 A | 8/2017 |
| CN | 108549121 A | 9/2018 |
| JP | 2009-158944 A | 7/2009 |
| JP | 2009-277798 A | 11/2009 |
| JP | 2010-041031 A | 2/2010 |
| JP | 20100-199289 A | 9/2010 |
| JP | 2015-216187 A | 12/2010 |
| JP | 2011-149901 A | 8/2011 |
| JP | 2011-222900 A | 11/2011 |
| JP | 2012-104753 A | 5/2012 |
| JP | 2013-033864 A | 2/2013 |
| JP | 2015-029054 A | 2/2015 |
| JP | 5793688 B2 | 10/2015 |
| JP | 2015-220313 A | 12/2015 |
| JP | 6303803 B2 | 4/2018 |
| KR | 10-2009-0118845 A | 11/2009 |
| KR | 10-2016-0029735 A | 3/2016 |
| TW | 200952164 A | 12/2009 |
| TW | 201225273 A | 6/2012 |
| TW | 201405792 A | 2/2014 |
| WO | 2010/004683 A1 | 1/2010 |
| WO | 2014/021115 A1 | 2/2014 |
| WO | 2015/001987 A1 | 1/2015 |
| WO | 2015/170629 A1 | 11/2015 |
| WO | 2015/174297 A1 | 11/2015 |

OTHER PUBLICATIONS

International Search Report and Written Opinion of PCT Application No. PCT/JP2016/081806, dated Dec. 13, 2016, 12 pages of English Translation and 09 pages of ISRWO.
International Preliminary Report on Patentability of PCT Application No. PCT/JP2016/081806, dated Jun. 21, 2018, 12 pages of English Translation and 07 pages of IPRP.
Final Office Action for U.S. Appl. No. 15/778,994 dated May 24, 2019.
Non-Final Office Action for U.S. Appl. No. 15/778,994 dated Sep 9, 2019.
Extended European Search Report of EP Patent Application No. 16872730.3, dated Nov. 29, 2018, 06 pages.
Notice of Allowance for U.S. Appl. No. 15/778,994 dated Mar. 12, 2020.
Non-Final Office Action for U.S. Appl. No. 16/898,961 dated Jun. 21, 2021.

* cited by examiner

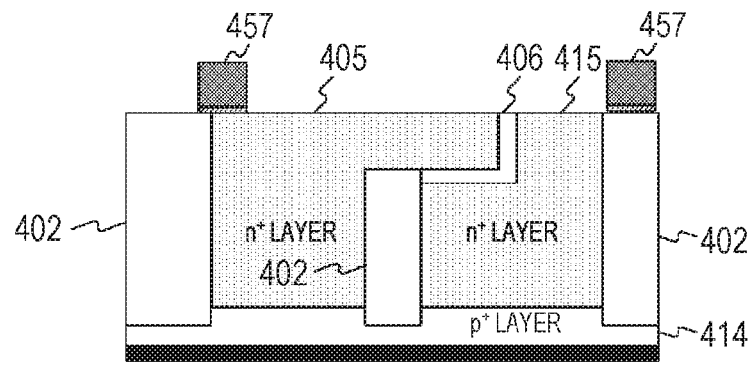
FIG. 15A
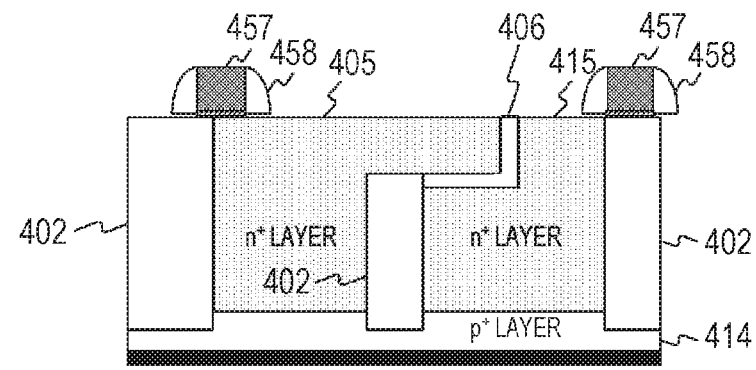
FIG. 15B
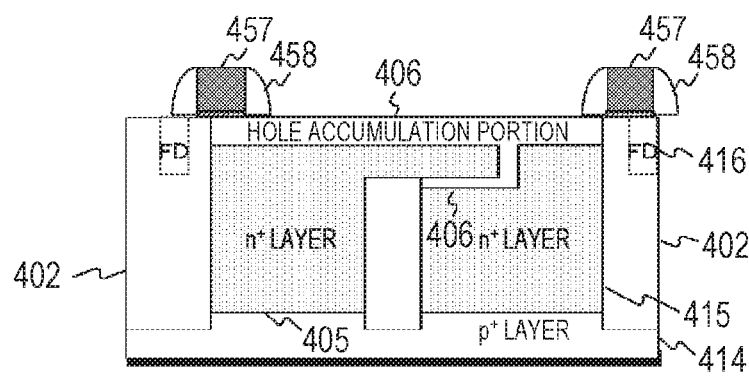
FIG. 15C
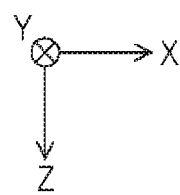

SOLID-STATE IMAGE PICKUP ELEMENT, IMAGE PICKUP DEVICE, AND METHOD OF MANUFACTURING SOLID-STATE IMAGE PICKUP ELEMENT

CROSS-REFERENCE TO RELATED APPLICATIONS

The present application is a continuation application of U.S. patent application Ser. No. 15/778,994, filed May 24, 2018, which is a National Stage of PCT/JP2016/081806, filed Oct. 27, 2016, and claims the benefit of priority from prior Japanese Patent Application JP 2015-242261, filed Dec. 11, 2015, the entire content of which are hereby incorporated by reference.

TECHNICAL FIELD

The present technology relates to a solid-state image pickup element, an image pickup device, and a method of manufacturing the solid-state image pickup element. Particularly, the present technology relates to a solid-state image pickup element and an image pickup device that are assumed to capture an image under low illumination, and a method of manufacturing the solid-state image pickup element.

BACKGROUND ART

Conventionally, an image pickup device includes a solid-state image pickup element in order to capture image data. In a case where an image is assumed to be captured under low illumination, such as night time, the solid-state image pickup element includes an infrared (IR) pixel that receives infrared light and a visible-light pixel that receives visible light, arranged. Such a solid-state image pickup element has often the amount of infrared light less than the amount of visible light, and thus the sensitivity of an IR pixel is required to improve preferentially. For example, a solid-state image pickup element having fine asperities provided on the light-receiving surface of an IR pixel, has been proposed for improvement in sensitivity (e.g., refer to Patent Document 1). The asperities allow the reflectance on the light-receiving surface to fall and the transmittance to rise relatively, so that the amount of light to be photoelectrically converted by the pixel increases and the sensitivity of the IR pixel improves in comparison to a case where no asperities are provided.

CITATION LIST

Patent Document

Patent Document 1: Japanese Patent Application Laid-Open No. 2010-199289

SUMMARY OF INVENTION

Problems to be Solved by the Invention

However, the conventional technology has a risk that the light incident on the IR pixel may leak into an adjacent visible-light pixel to cause color mixture. In addition, there is a risk that the sensitivity of the IR pixel may not improve sufficiently due to the leak of the light. Thus, a problem that the color mixture or the insufficient sensitivity degrades image quality, occurs. In addition, the color mixture or the insufficient sensitivity causes a problem to the visible-light pixel in some cases.

The present technology has been made in consideration of the circumstances, and an object of the present technology is to improve sensitivity in a solid-state image pickup element, inhibiting color mixture.

Solutions to Problems

The present technology has been made in order to solve the problems, and a first aspect of the present technology is a solid-state image pickup element including: a pixel having a plurality of protrusions formed on a light-receiving surface; a light-receiving-surface-sided trench being a trench formed around the pixel at the light-receiving surface; and a light-receiving-surface-sided member buried in the light-receiving-surface-sided trench. This arrangement achieves a function of reducing the reflectance on the light-receiving surface and preventing color mixture.

In addition, according to the first aspect, an interval between respective representative points of the plurality of protrusions, may be 250 nanometers or more. This arrangement achieves a function of reducing the reflectance on the light-receiving surface with the plurality of protrusions having the interval of 250 nanometers or more.

In addition, according to the first aspect, an interval between respective representative points of the plurality of protrusions may be substantially identical to a divisor of the pixel in size in a predetermined direction parallel to the light-receiving surface. This arrangement achieves a function of reducing the reflectance on the light-receiving surface with the plurality of protrusions having the interval of the divisor of the pixel in size.

In addition, according to the first aspect, the plurality of protrusions may be formed in a partial region of the pixel at the light-receiving surface. This arrangement achieves a function of reducing the reflectance on the light-receiving surface with the plurality of protrusions formed in the partial region of the pixel.

In addition, according to the first aspect, the light-receiving-surface-sided trench may be two micrometers or more in depth. This arrangement achieves a function of shielding light with the light-receiving-surface-sided trench having the depth of two micrometers or more.

In addition, according to the first aspect, the light-receiving-surface-sided member may include a member lower in refractive index than the pixel. This arrangement achieves a function of reflecting and scattering light with the member lower in refractive index than the pixel.

In addition, according to the first aspect, the light-receiving-surface-sided member may include metal. This arrangement achieves a function of absorbing light with the metal.

In addition, according to the first aspect, the pixel may include: an infrared-light pixel configured to receive infrared light; and a visible-light pixel configured to receive visible light. This arrangement achieves a function of receiving the infrared light and the visible-light pixel.

In addition, according to the first aspect, the plurality of protrusions may be formed at the infrared-light pixel. This arrangement achieves a function of reducing the reflectance on the light-receiving surface of the infrared-light pixel.

In addition, according to the first aspect, the plurality of protrusions may be formed at both of the infrared-light pixel and the visible-light pixel. This arrangement achieves a function of reducing the reflectance on each of the light-receiving surfaces of the infrared-light pixel and the visible-light pixel.

In addition, according to the first aspect, there may be further provided an infrared-light interrupting filter configured to interrupt the infrared light from the visible light and the infrared light, the infrared-light interrupting filter being arranged between the visible-light pixel and an image pickup lens. This arrangement achieves a function of interrupting the infrared light.

In addition, according to the first aspect, the infrared-light pixel may include a first photoelectric conversion portion configured to photoelectrically convert the infrared light; the visible-light pixel may include a second photoelectric conversion portion configured to photoelectrically convert the visible light; and the first photoelectric conversion portion may expand beneath the second photoelectric conversion portion with a direction toward the image pickup lens regarded as being upward. This arrangement achieves a function of improving the sensitivity of the infrared-light pixel.

In addition, according to the first aspect, the infrared-light pixel may include a photoelectric conversion portion configured to photoelectrically convert the light, and the light-receiving-surface-sided trench may be smaller in depth than the photoelectric conversion portion of the infrared-light pixel. This arrangement achieves a function of enabling the photoelectric conversion portion to pass under the light-receiving-surface-sided trench to expand.

In addition, according to the first aspect, a plurality of the pixels may be provided; the plurality of pixels each may receive light having an individual different wavelength; and the plurality of pixels each may include a photoelectric conversion portion having a depth corresponding to the wavelength of the light. This arrangement achieves a function of performing photoelectric conversion with the photoelectric conversion portion having the depth corresponding to the wavelength.

In addition, according to the first aspect, a plurality of the pixels may be provided; the plurality of pixels each may receive light having an individual different wavelength; and an interval between respective representative points of the plurality of protrusions, may have a value corresponding to the wavelength of the light to be received by the pixel provided with the plurality of protrusions. This arrangement achieves a function of achieving reduction of the reflectance corresponding to the wavelength of the light.

In addition, according to the first aspect, there may be further provided: an opposed-surface-sided trench formed at an opposed surface opposed to the light-receiving surface of a substrate having the pixel formed; and an opposed-surface-sided member buried in the opposed-surface-sided trench. This arrangement achieves a function of reflecting and scattering light with the opposed-surface-sided member buried in the opposed-surface-sided trench.

In addition, according to the first aspect, the opposed-surface-sided member may include a member lower in refractive index than the pixel. This arrangement achieves a function of reflecting and scattering light with the member lower in refractive index than the pixel.

In addition, a second aspect of the present technology is an image pickup device including: a solid-state image pickup element including: a pixel having a plurality of protrusions on a light-receiving surface; a light-receiving-surface-sided trench being a trench formed around the pixel at the light-receiving surface; and a light-receiving-surface-sided member buried in the light-receiving-surface-sided trench; and an image pickup lens configured to guide light to the solid-state image pickup element. This arrangement achieves a function of reducing the reflectance on the light-receiving surface and preventing color mixture.

In addition, according to the second aspect, there may be further provided: an infrared-light interrupting filter configured to interrupt infrared light; and an insertion and removal unit configured to perform insertion of the infrared-light interrupting filter into a predetermined position between the image pickup lens and the solid-state image pickup element or removal of the infrared-light interrupting filter from the predetermined position. The pixel may include: an infrared-light pixel configured to receive the infrared light; and a visible-light pixel configured to receive visible light. This arrangement achieves a function of interrupting the infrared light.

In addition, according to the second aspect, the solid-state image pickup element may further include a signal processing unit configured to process a pixel signal from the pixel. This arrangement achieves a function of generating image data from the pixel signal subjected to the signal processing.

In addition, a third aspect of the present technology is a method of manufacturing a solid-state image pickup element, the method including: a pixel formation process of forming a pixel at a substrate; a protrusion formation process of forming a plurality of protrusions at a light-receiving surface of the pixel; a trench formation process of forming, as a light-receiving-surface-sided trench, a trench around the pixel at the light-receiving surface; and a burying process of burying a light-receiving-surface-sided member in the light-receiving-surface-sided trench. This arrangement achieves a function of manufacturing the solid-state image pickup element including: the pixel having the plurality of protrusions formed on the light-receiving surface; the light-receiving-surface-sided trench formed therearound; and the light-receiving-surface-sided shielding member buried in the light-receiving-surface-sided trench.

In addition, according to the second aspect, the plurality of protrusions may be formed by wet etching. This arrangement achieves a function of generating the plurality of protrusions with the wet etching.

Effects of the Invention

According to the present technology, an outstanding effect of enabling the color mixture to be inhibited and the sensitivity to improve in the solid-state image pickup element, can be achieved. Note that, the effects described here are not necessarily limited, and any of the effects described in the present disclosure may be provided.

BRIEF DESCRIPTION OF DRAWINGS

FIGS. 15A, 15B, and 15C illustrate the descriptions of a manufacturing process of forming a transistor and a floating diffusion layer according to the first embodiment of the present technology.

MODE FOR CARRYING OUT THE INVENTION

Modes for carrying out the present technology (hereinafter, referred to as embodiments) will be described below. The descriptions will be given in the following order.
1. First Embodiment (example of an IR pixel having a moth-eye structure with a trench provided therearound)
2. Second Embodiment (example of an IR pixel and a visible-light pixel each having a moth-eye structure with a trench provided therearound)
3. Third Embodiment (example of an IR pixel having a moth-eye structure with a trench provided therearound and an IR cut-off filter arranged)
4. Fourth Embodiment (example of an IR pixel having a moth-eye structure with a trench provided therearound at the back and a trench provided at the front).

1. First Embodiment

[Exemplary Configuration of Image Pickup Device]

Figure 1:
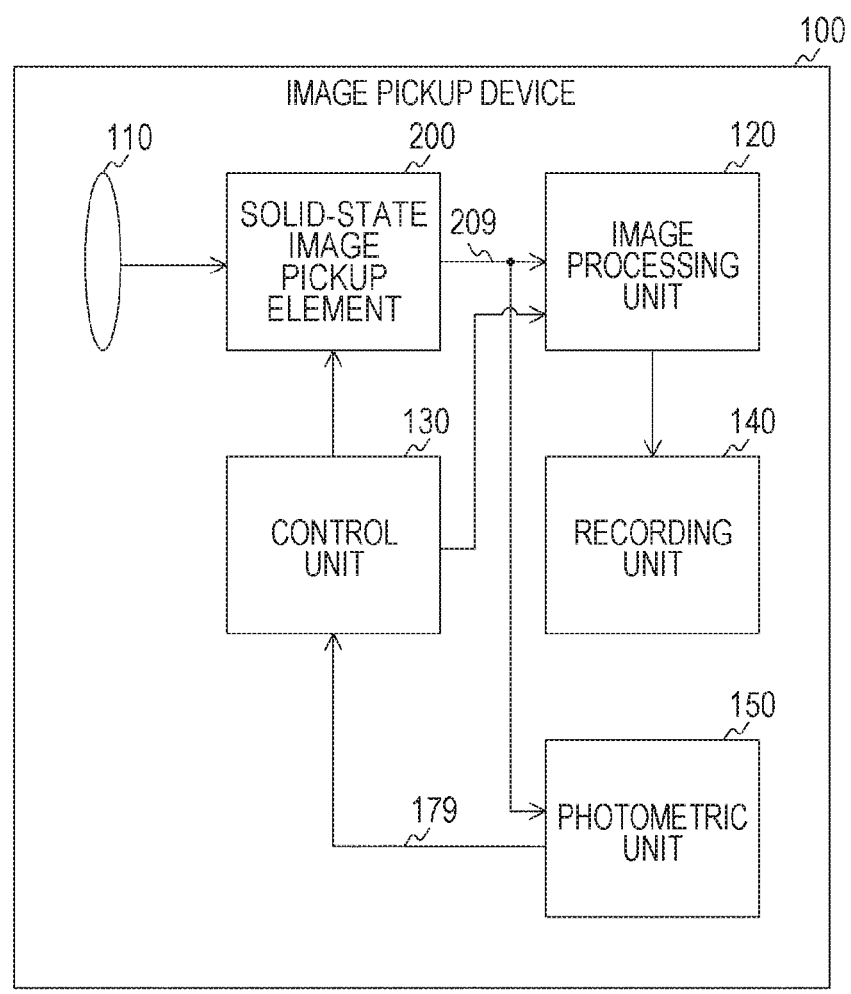
FIG. 1 is a block diagram of an exemplary configuration of an image pickup device according to a first embodiment of the present technology.

FIG. 1 is a block diagram of an exemplary configuration of an image pickup device 100 according to a first embodiment. The image pickup device 100 includes an image pickup lens 110, a solid-state image pickup element 200, an image processing unit 120, a control unit 130, a recording unit 140, and a photometric unit 150.

The image pickup lens 110 condenses light and guides the light to the solid-state image pickup element 200. The solid-state image pickup element 200 captures image data in accordance with the control of the control unit 130, and provides the image processing unit 120 and the photometric unit 150 with the image data through a signal line 209. The solid-state image pickup element 200 includes a visible-light pixel that receives visible light and a near-infrared-light pixel that receives near-infrared light. As the near-infrared-light pixel, for example, there is provided an IR pixel that receives infrared light through an IR transmissive filter that selectively transmits near-infrared light in a wavelength region of 0.14 to 1.4 micrometers (μm). The image data unprocessed, output from the solid-state image pickup element 200 is called as RAW image data. Note that, the near-infrared-light pixel is an exemplary infrared-light pixel described in the claims.

The image processing unit 120 performs predetermined image processing to the RAW image data, in accordance with the control of the control unit 130. The image processing unit 120 provides the recording unit 140 with the image data processed, through a signal line 129. The recording unit 140 records the image data. The photometric unit 150 measures the amount of light on the basis of the image data. The photometric unit 150 provides the control unit 130 with the photometric amount.

The control unit 130 controls the entire solid-state image pickup element 200. The control unit 130 controls the solid-state image pickup element 200 to capture the image data, and controls the image processing unit 120 to perform the image processing in synchronization with the capturing of the image data. In addition, the control unit 130 alters the details of the image processing to be performed by the image processing unit 120, on the basis of the photometric amount. For example, in a case where the photometric amount is a threshold value or less, the control unit 130 causes the image processing unit 120 to generate the image data in monochrome, on the basis of a pixel signal of the IR pixel in the RAW image data. Meanwhile, in a case where the photometric amount is more than the threshold value, the control unit 130 causes the image data in color to be generated with, for example, demosaic processing, on the basis of a pixel signal of the visible-light pixel in the RAW image data.

Note that, the control unit 130 may control the image processing unit 120, on the basis of information different from the photometric amount. For example, the control unit 130 causes the image data to be generated from the pixel signal of the IR pixel, on the basis of time information indicating a time zone, such as night time, and causes the image data to be generated from the visible-light pixel, on the basis of the time information indicating the time zone of day time. Alternatively, the control unit 130 controls the image processing unit 120, on the basis of an operation signal generated by an operation of a user.

[Exemplary Configuration of Solid-State Image Pickup Element]

Figure 2:
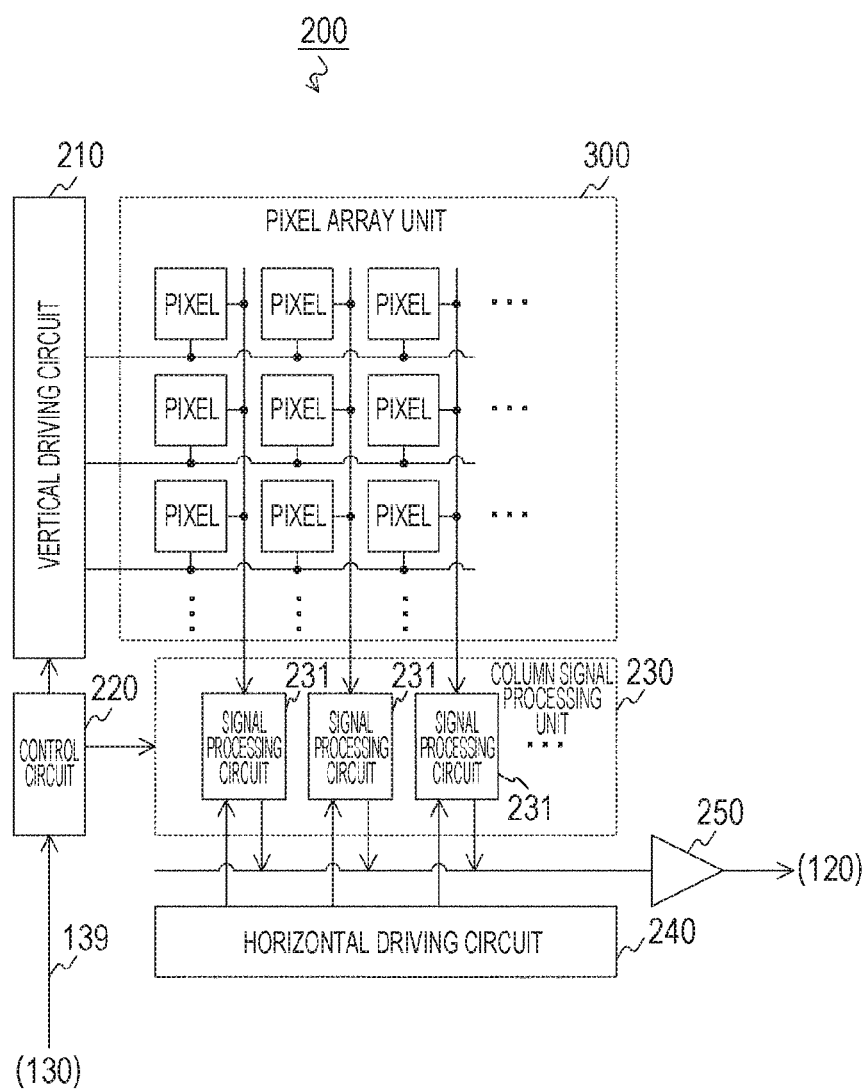
FIG. 2 is a block diagram of an exemplary configuration of a solid-state image pickup element according to the first embodiment of the present technology.

FIG. 2 is a block diagram of an exemplary configuration of the solid-state image pickup element 200 according to the first embodiment. The solid-state image pickup element 200 includes a vertical driving circuit 210, a pixel array unit 300, a control circuit 220, a column signal processing unit 230, a horizontal driving circuit 240, and an output circuit 250. The pixel array unit 300 includes a plurality of pixels arranged in a two-dimensional lattice shape. Here, pixels arranged horizontally are referred to as a "row" and pixels arranged vertically are referred to as a "column". The column signal processing unit 230 includes a signal processing circuit 231 provided for each column.

The control circuit 220 controls the entire solid-state image pickup element 200. For example, the control circuit 220 generates a timing signal in accordance with the control of the control unit 130, to provide the vertical driving circuit 210 and the horizontal driving circuit 240 with the timing signal. The timing signal indicates timing for selection between row and column.

The vertical driving circuit 210 sequentially selects a row to be exposed, in accordance with the control of the control circuit 220.

The signal processing circuit 231 performs predetermined signal processing to a pixel signal from each pixel in the corresponding column. For example, correlated double sampling (CDS) processing or analog to digital (AD) conversion processing for removing pixel-unique fixed pattern noise, is performed as the signal processing. The signal processing circuit 231 provides the output circuit 250 with the pixel signal processed, in accordance with the control of the horizontal driving circuit 240.

The horizontal driving circuit 240 sequentially selects a signal processing circuit 231 to output the pixel signal, in accordance with the control of the control circuit 220.

The output circuit 250 performs buffering to the pixel signal from the column signal processing unit 230, to make an output to the image processing unit 120. As necessary, the output circuit 250 performs various types of digital signal processing, such as black level adjustment and column variation correction, in addition to the buffering.

[Exemplary Configuration of Pixel Array Unit]

Figure 3:
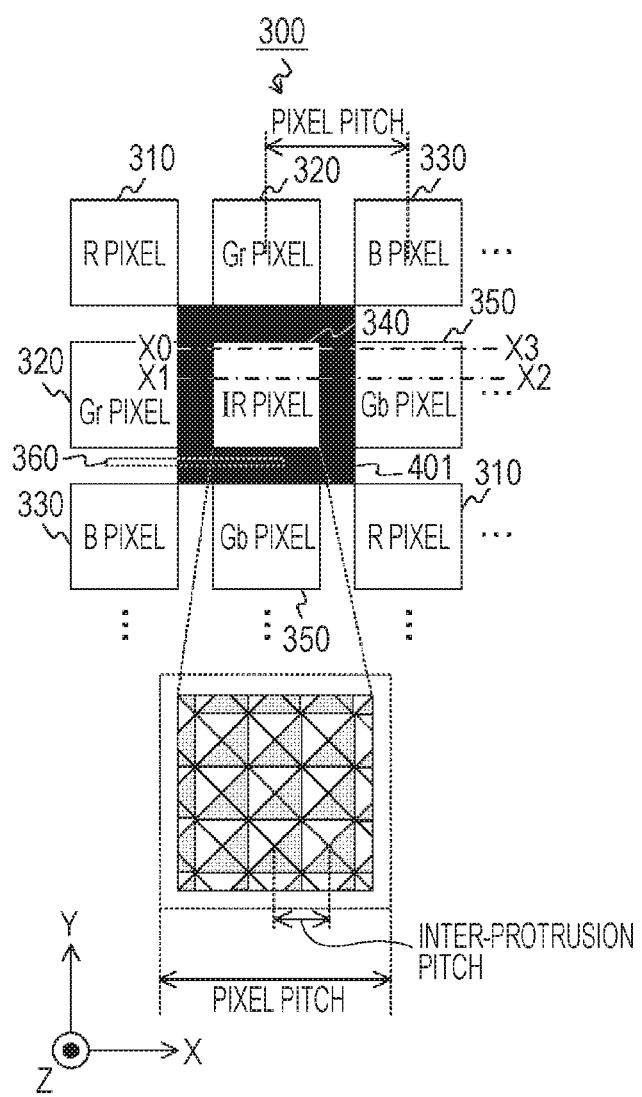
FIG. 3 is an exemplary top view of a pixel array unit according to the first embodiment of the present technology.

FIG. 3 is an exemplary top view of the pixel array unit 300 according to the first embodiment. The pixel array unit 300 includes a visible-light pixel and a near-infrared-light pixel provided.

Examples of the visible-light pixel provided include an R pixel 310, a Gr pixel 320, a B pixel 330, and a Gb pixel 350. The R pixel 310 from the pixels is a pixel that receives light through a color filter that selectively transmits red light, and the Gr pixel 320 and the Gb pixel 350 each are a pixel that receives light through a color filter that selectively transmits green light. In addition, the B pixel 330 is a pixel that receives light through a color filter that selectively transmits blue light.

In addition, an example of the near-infrared-light pixel provided is an IR pixel 340. Note that, the optical filter for each pixel is omitted for convenience of illustration in FIG. 3.

The R pixel 310, the Gr pixel 320, the B pixel 330, the IR pixel 340, and the Gb pixel 350 each are arranged in a predetermined pattern. In addition, a pixel separation region is formed between the pixels. The interval between the respective representative points (e.g., centers) of the adjacent pixels, is hereinafter referred to as a "pixel pitch". Additionally, a trench having a certain depth is formed in the pixel separation region around the IR pixel, and the trench has metal 401 buried.

In addition, a plurality of protrusions each having a predetermined shape is formed at predetermined intervals on the light-receiving surface of the IR pixel 340. The predetermined shape of each protrusion is, for example, a quadrangular pyramid. The interval between the respective representative points (e.g., apexes) of the adjacent protrusions, is hereinafter referred to as an "inter-protrusion pitch". The inter-protrusion pitch is smaller than the wavelength of the infrared light that the IR pixel receives (e.g., 800 nanometers). The provision of the protrusions at the fine intervals in this manner allows a gradual variation to occur in refractive index from the apex of each protrusion to the bottom, in comparison to no provision of the protrusions. This arrangement allows the reflectance of the light on the light-receiving surface to fall, so that the transmittance of the light rises by the fall. The structure of the surface having the plurality of protrusions arranged at the intervals each shorter than the wavelength of the light to be received (e.g., infrared light) in this manner, is typically called a moth-eye structure.

The moth-eye structure of the IR pixel 340 improves the transmittance at the light-receiving surface, so that the sensitivity of the IR pixel 340 improves. In addition, the metal in the trench around the IR pixel 340 absorbs the light transmitted through the IR pixel 340, so that no light leaks into the adjacent pixels. This arrangement improves the sensitivity of the IR pixel and reduces color mixture. The improvement of the sensitivity and the reduction of the color mixture improve the image quality of the image data captured by the solid-state image pickup element 200.

Here, the inter-protrusion pitch is set to an optimum value in accordance with the wavelength, and may be set to, for example, a divisor of the pixel pitch. In a case where the pixel pitch is 2500 nanometers (nm), the inter-protrusion pitch is set to, for example, 250 nanometers (nm) nm being a divisor thereof. A manufacturing device forms the moth-eye structure having the inter-protrusion pitch set, into a region including the IR pixel 340 and part of the pixel separation region therearound, the region having one side the same in length as the pixel pitch. Then, after the formation of the moth-eye structure, the manufacturing device trims part of the protrusions astride the boundary between the IR pixel 340 and the pixel separation region, to form the trench.

Meanwhile, the light-receiving surface of each of the visible-light pixels (e.g., R pixel 310) except the IR pixel 340, has a flat surface with no protrusions provided.

In addition, a transistor formation region 360 in which a transistor (e.g., a reset transistor) common between a plurality of pixels is formed, is provided in the pixel separation region.

Note that, all the IR pixels 340 do not necessarily have the moth-eye structure and the trench is not necessarily required to be formed around each of the IR pixels 340. For example, only part of the IR pixels 340 may have the moth-eye structure and the trench may be formed only around the part of the IR pixels 340.

[Exemplary Configuration of Pixel Circuit]

Figure 4:
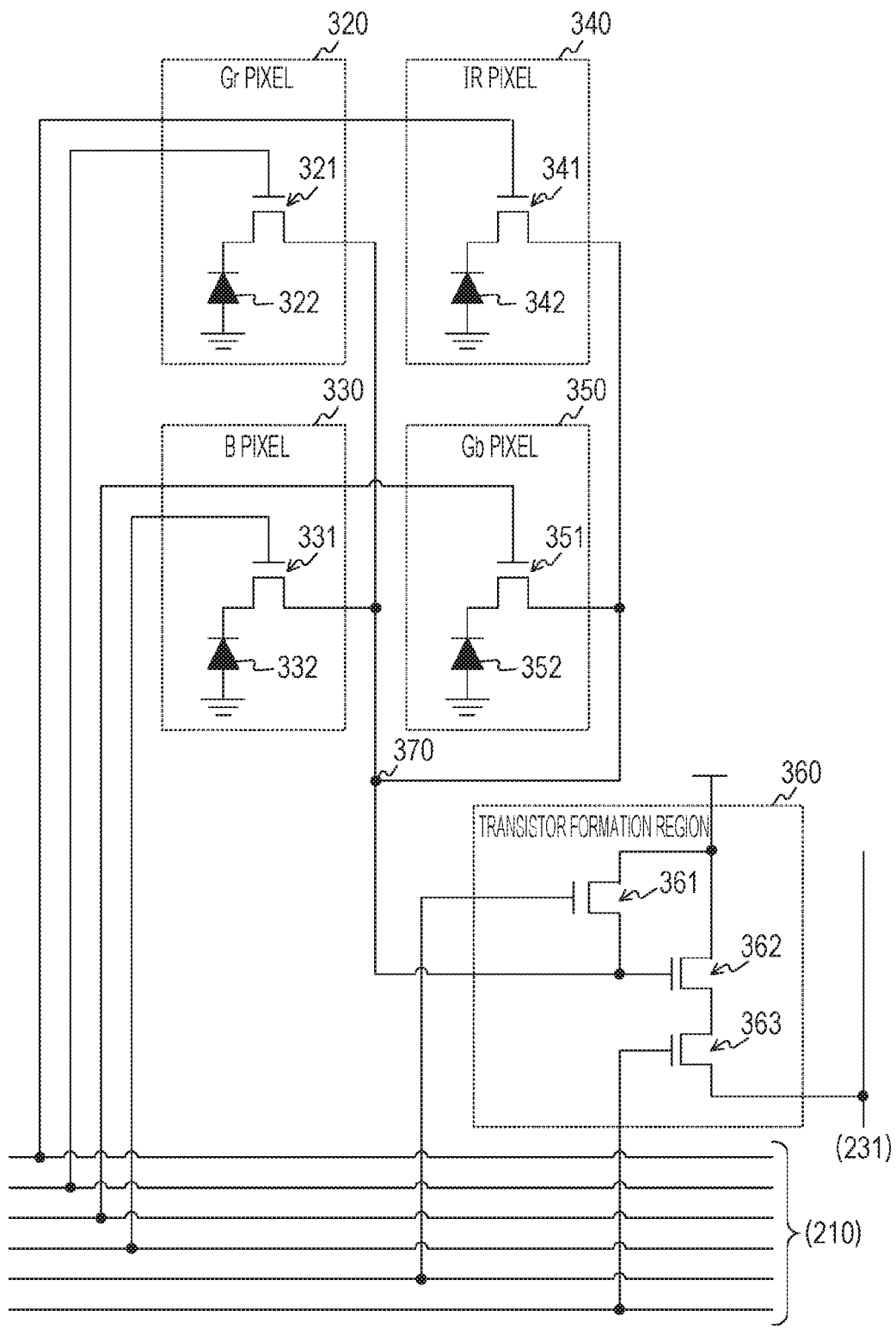
FIG. 4 is an exemplary circuit diagram of a pixel circuit according to the first embodiment of the present technology.

FIG. 4 is an exemplary circuit diagram of a pixel circuit according to the first embodiment. The Gr pixel 320 includes a transfer transistor 321 and a photodiode 322, and the B pixel 330 includes a transfer transistor 331 and a photodiode 332. The IR pixel 340 includes a transfer transistor 341 and a photodiode 342, and the Gb pixel 350 includes a transfer transistor 351 and a photodiode 352. In addition, the pixel separation region is provided with a floating diffusion layer 370, and the transistor formation region 360 is provided with a reset transistor 361, an amplification transistor 362, and a selection transistor 363.

The photodiode 322 photoelectrically converts the received light into electric charge. The photodiode 322 supplies the generated electric charge to the transfer transistor 321. The transfer transistor 321 transfers the electric charge from the photodiode 322, to the floating diffusion layer 370, in accordance with the control of the vertical driving circuit 210.

The configurations of the photodiodes 332, 342, and 352 are similar to that of the photodiode 322. In addition, the configurations of the transfer transistors 331, 341, and 351 are similar to that of the transfer transistor 321.

The floating diffusion layer 370 accumulates the electric charge from any of the transfer transistors 321, 331, 341, and 351, and generates voltage corresponding to an accumulated amount. The floating diffusion layer 370 supplies the pixel signal having the generated voltage, to the amplification transistor 362.

The reset transistor 361 discharges the electric charge in the floating diffusion layer 370 to initialize the voltage of the floating diffusion layer 370, in accordance with the control of the vertical driving circuit 210.

The amplification transistor 362 amplifies the electrical signal from the floating diffusion layer 370 and supplies the electrical signal as the pixel signal to the selection transistor 363.

The selection transistor 363 supplies the pixel signal to the signal processing circuit 231 through a vertical signal line, in accordance with the control of the vertical driving circuit 210.

Note that, the floating diffusion layer 370 and the transistor formation region 360 are common between the adjacent four pixels, but the embodiment is not limited to this. For example, a floating diffusion layer 370 may be common between adjacent two pixels, or each pixel may be provided with, for example, an individual floating diffusion layer 370 not to be shared between the other pixels.

Figure 5:
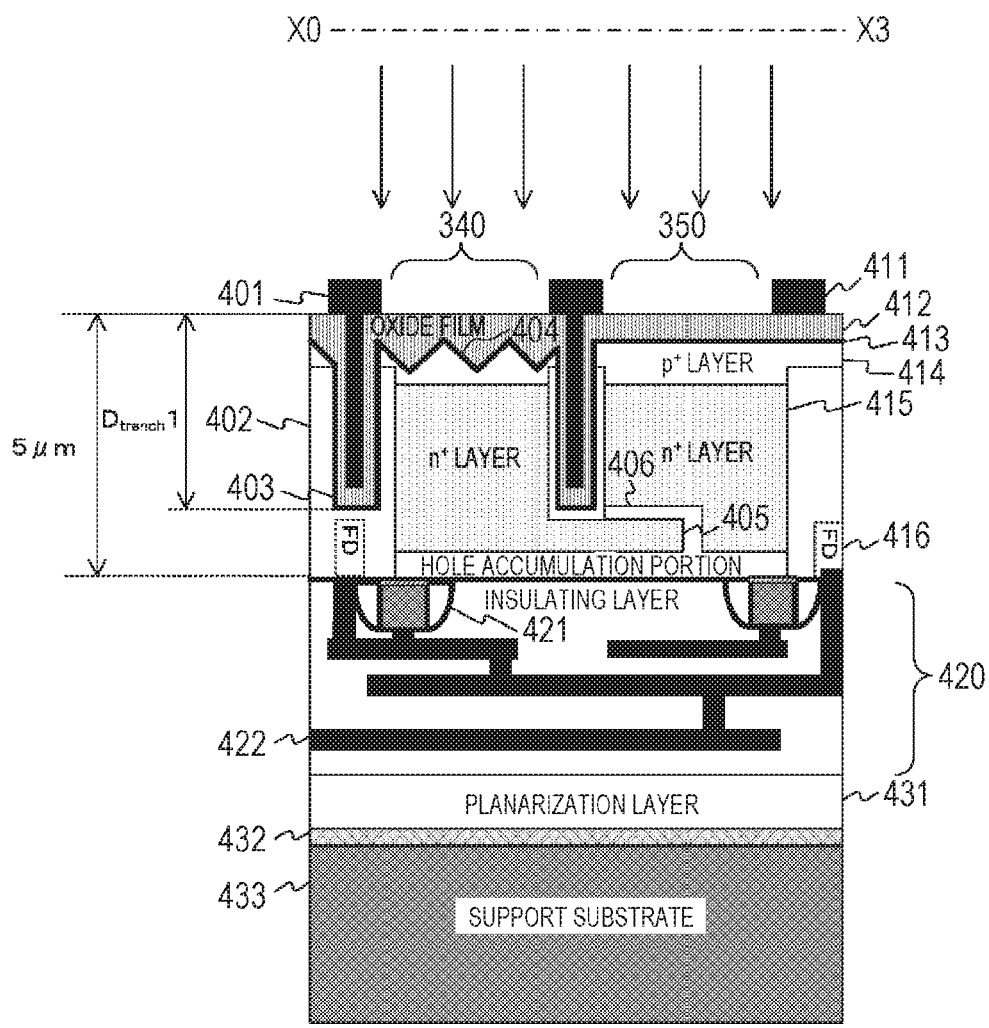
FIG. 5 is an exemplary sectional view of the pixel array unit according to the first embodiment of the present technology.

FIG. 5 is an exemplary sectional view of the pixel array unit 300 according to the first embodiment. The sectional view is taken along line X0-X3 of FIG. 3.

With the direction from a support substrate 433 to the light-receiving surface, regarded as an upward direction, an adhesion layer 432 is formed on the support substrate 433 and a planarization layer 431 is formed on the adhesion layer 432. An insulating layer 420 is formed on the planarization layer 431, and the transfer transistors 421 and wiring 422 are provided in the insulating layer 420. The pixels, such as the IR pixel 340 and the Gb pixel 350, and the pixel separation region 402 are provided on the upper portion of the insulating layer 420. Silicon on the upper portion of the insulating layer 420 including the wiring and the transistors, is, for example, 5 micrometers (μm) in thickness.

The IR pixel 340 includes an n+ layer 405 formed and the Gb pixel 350 includes an n+ layer 415 formed. The n+ layers each function as a photodiode. In addition, the region of the n+ layer 405 in the IR pixel 340 expands beneath the adjacent n+ layer 415. In this manner, the expansion of the photodiode (n+ layer 405) of the IR pixel 340, can improve the sensitivity of the IR pixel 340. Note that, all the IR pixels 340 are not necessarily required to expand the photo diodes. For example, only part of the IR pixels 340 may have the photodiode expanded, and the remaining IR pixels 340 each may have the same configuration as the visible-light pixels have. In addition, if only the moth-eye structure makes the sensitivity sufficient, the region of the 405 is not necessarily expanded.

In addition, a hole accumulation portion 406 for inhibition of a dark current from an interface, is provided between the n+ layer 405, the n+ layer 415, and the insulating layer 420 including the wiring and the transistors. The hole accumulation portion 406 is formed with, for example, a p+ layer.

In addition, a p+ layer 404 being a hole accumulation portion, is formed on the upper portion of the n+ layer 405, and a plurality of protrusions is formed on the front of the p+ layer 414. Meanwhile, a p+ layer 414 is formed on the upper portion of the n+ layer 415, and the front thereof is flat.

Additionally, the trench 403 having the certain depth Dtrench1 is formed in the pixel separation region 402 around the IR pixel 340. The depth of the trench 403 is smaller than that of the n+ layer 405. Making the trench 403 shallower than the n+ layer 405, enables the n+ layer 405 to pass under the trench 403 and expand beneath the n+ layer 415. Note that, the trench 403 is an exemplary light-receiving-surface-sided trench described in the claims.

In addition, a fixed charged membrane 413 is formed on the trench 403 and the fronts of the p+ layers 404 and 414. An oxide film 412 lower in refractive index than silicon, is formed on the upper portion of the fixed charged membrane 413. According to the Fresnel Equations, part of light incident from a medium having a high refractive index (e.g., p+ layer 404) onto a medium having a low refractive index (oxide film 412), reflects from the interface therebetween, and thus the oxide film 412 functions as a material that prevents the light from leaking from each pixel.

In addition, the metal 401 is buried in the trench around the IR pixel 340. Meanwhile, no trench is formed in the pixel separation region 402 between the Gb pixel 350 and the adjacent visible-light pixel, and metal 411 is arranged on the upper portion thereof through the oxide film 412. The pieces of metal each also function as a shielding material that prevents the light from leaking from each pixel. Note that, the metal 411 is an exemplary light-receiving-surface-sided member described in the claims.

As described above, the solid-state image pickup element 200 having the light-receiving surface at the back opposed to the insulating layer 420 including the wiring and the transistors, at the front, is typically called a back-illuminated solid-state image pickup element.

Figure 6:
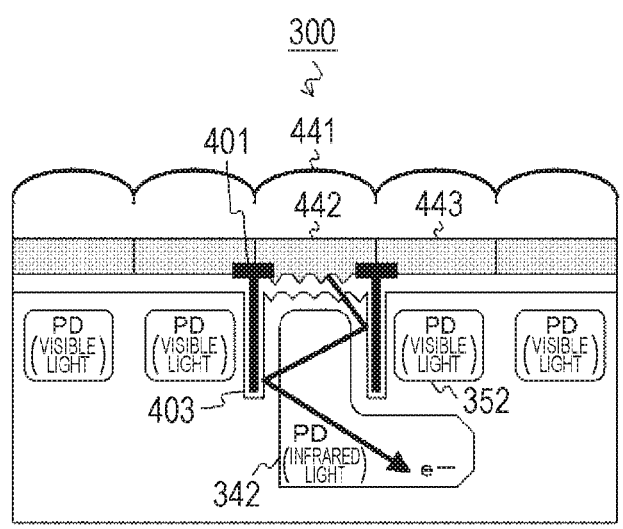
FIG. 6 is an exemplary schematic sectional view of the structure of the pixel array unit according to the first embodiment of the present technology.

FIG. 6 is an exemplary schematic sectional view of the structure of the pixel array unit 300 according to the first embodiment. The sectional view of FIG. 6 is taken along line X1-X2 of FIG. 3. The IR pixel is provided with an on-chip IR transmissive filter 442 that transmits only infrared light, and the visible-light pixels (e.g., R pixel) each are provided with an on-chip color filter 443 that selectively transmits visible light having the corresponding wavelength (e.g., red). In addition, an on-chip lens 441 is provided on the upper portions of the optical filters. For example, an oxide film having a thickness of 100 nanometers (nm) (not illustrated) is deposited as an antireflection film on the on-chip lens 441.

Additionally, the trench is provided in the pixel separation region around the IR pixel, and the metal 401 is buried in the trench. In addition, the photodiode 342 of the IR pixel expands beneath the photodiode 352 of the visible-light pixel.

An arrow in a solid line in FIG. 6 is an exemplary locus of the infrared light incident on the IR pixel. The moth-eye structure of the IR pixel reduces the reflectance on the light-receiving surface of the IR pixel, so that almost all the infrared light passes through the light-receiving surface. Then, the metal 401 around the IR pixel shields the transmitted light, so that the infrared light is inhibited from leaking from the IR pixel to the adjacent pixels and the color mixture is prevented. In addition, the photodiode 342 of the IR pixel expands in comparison to that of each of the visible-light pixels.

Here, no IR cut-off filter that interrupts the infrared light, is provided on the upper portion of each of the visible-light pixels, and thus the infrared light is slightly incident on the visible-light pixels. However, the photodiode 342 of the IR pixel expanding beneath the visible-light pixel, detects the infrared light incident on the visible-light pixel, so that the infrared light hardly disturbs the color balance of the visible-light pixel.

The moth-eye structure, the reflection of the metal 401, and the expansion of the photodiode 342 improve the sensitivity of the IR pixel. In addition, the shielding of the metal 401 can prevent the color mixture. The improvement of the sensitivity and the prevention of the color mixture can improve the image quality of the image data.

Note that, the IR pixel is provided with the IR transmissive filter 442 that transmits only the infrared light, but an optical filter that transmits infrared light and visible light may be provided instead. Alternatively, no optical filter may be provided at the position of the IR pixel. In this case, a W (white) pixel is provided instead of the IR pixel. For the configurations, the subsequent-stage image processing unit 120 separates a visible light component and an infrared light component with computing, to generate a monochrome image or a color image.

Figure 7:
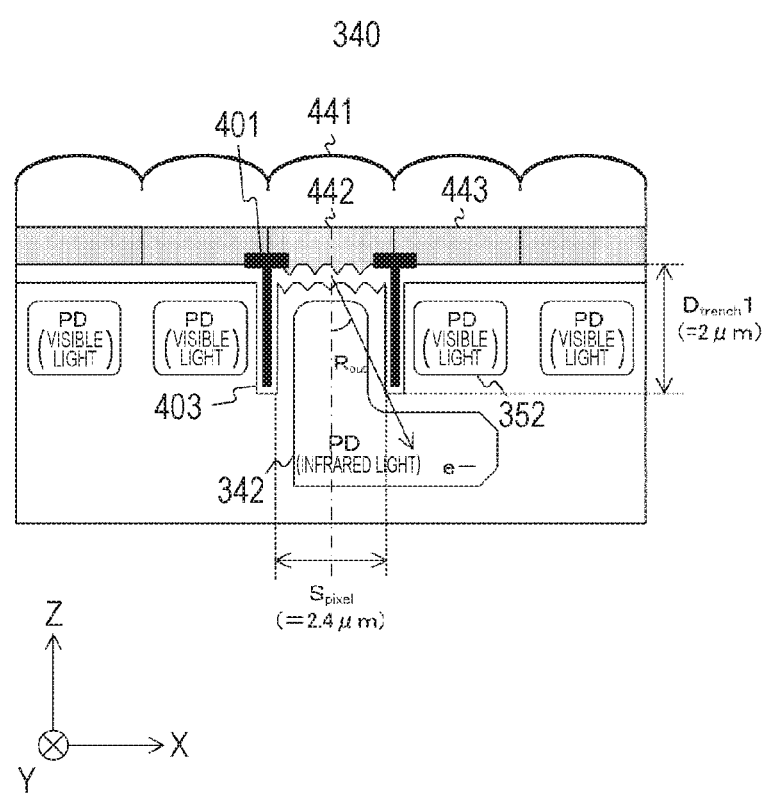
FIG. 7 is a view for describing the relationship between an inter-protrusion pitch and the depth of a trench according to the first embodiment of the present technology.

FIG. 7 is a view for describing the relationship between the inter-protrusion pitch and the depth of the trench according to the first embodiment. The transmittance of light varies between the apex and lower portion of each protrusion of the moth-eye structure, and thus diffraction of infrared light occurs in the moth-eye structure with each protrusion as the unit of diffraction (namely, diffraction grating). Typically, the emergent angle Rout of light diffracted after incidence from a medium having a refractive index nin onto a medium having a refractive index nout (namely, the angle of diffraction), is calculated by the following expression.

$$n_{out} \times P \times \sin R_{out} - n_{in} \times \sin R_{in} = m\lambda \quad \text{[Mathematical Formula 1]}$$

where Rin represents the incident angle of the light incident from the medium having the refractive index nin onto the medium having the refractive index nout, and the unit of the incident angle Rin and the emergent angle Rout is expressed in, for example, "degrees". P represents the inter-grating interval of the diffraction grating (protrusions) (namely, inter-protrusion pitch), and the unit is expressed in, for example, nanometers (nm). m represents the order of diffraction. Lambda represents the wavelength of the diffracted light (e.g., infrared light) diffracted by the diffraction grating, and the unit is expressed in, for example, nanometers (nm).

In addition, when the light diffracted at the center of the pixel passes through a close position to the bottom portion of the trench and leaks out, the relationship between the size Spixel of one side of the pixel and the depth Dtrench1 of the trench is expressed by the following expression with a trigonometric function.

$$D\text{trench1} \times \sin(R\text{out}) = S\text{pixel}/2 \quad \text{Expression 2}$$

Determination of one of the depth Dtrench1 of the trench and the inter-protrusion pitch P enables the other value to be calculated by Expression 1 and Expression 2. For example, when the depth Dtrench1 of the trench is defined as 2000 nanometers (nm) and the pixel size Spixel is defined as 2400 nanometers (nm), a value of approximately 31 degrees is calculated as the emergent angle Rout by Expression 2.

In addition, the first-order diffracted light is most dominant in the diffracted light, and thus the order of diffraction m is defined as "1" and the wavelength of the infrared light is defined as 800 nanometers (nm). In addition, the refractive index nin of air being the medium on the incident side is defined as "1.000" and the incident angle Rin is defined as "0" degrees. Then, the refractive index nout of silicon being the medium on the emergent side is defined as "3.712". When the emergent angle Rout is 31 degrees, a value of approximately 418 nanometers (nm) is calculated as the inter-protrusion pitch P by Expression 1. As the inter-protrusion pitch P decreases, the emergent angle Rout increases according to Expression 1, resulting in reduction of the risk that the infrared light may pass beneath the trench. Therefore, under the condition, it is desirable that the emergent angle Rout has a slight margin and the inter-protrusion pitch P is 400 nanometers (nm) or less. For example, if the inter-protrusion pitch P is 400 nanometers (nm), the emergent angle Rout is 32.6 degrees sufficiently larger than 31 degrees.

In addition, conversely, with determination of the inter-protrusion pitch P, the depth Dtrench1 of the trench may be calculated by Expression 1 and Expression 2. For example, if the inter-protrusion pitch P is approximately 400 nanometers (nm), a value of approximately 2227 nanometers (nm), namely, a value of approximately 2.227 micrometers (μm) is acquired as the depth Dtrench1 of the trench. The depth Dtrench1 of the trench is desirably two micrometers (μm) or more.

Figure 8:
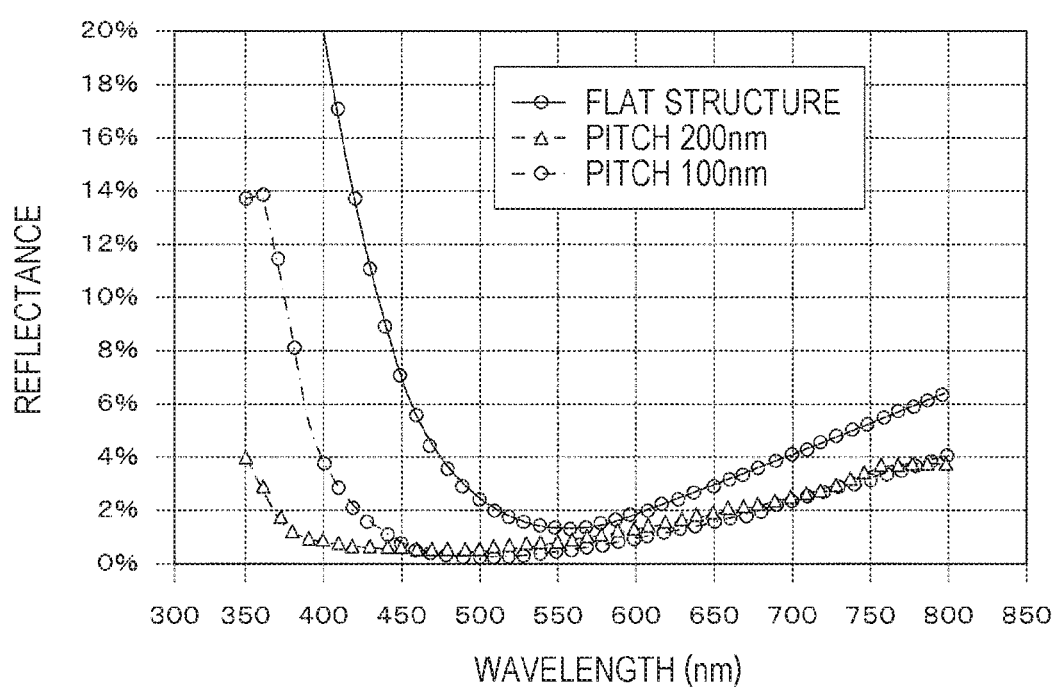
FIG. 8 is a graph of an exemplary relationship between reflectance and wavelength according to the first embodiment of the present technology.

FIG. 8 is a graph of an exemplary relationship between reflectance and wavelength according to the first embodiment. In the figure, the vertical axis represents the reflectance and the horizontal axis represents the wavelength of light. In addition, a solid line indicates a reflectance characteristic as a function of wavelength in a pixel having a flat light-receiving surface, and a dotted line indicates a reflectance characteristic as a function of wavelength in a pixel having a light-receiving surface having the moth-eye structure, the pixel having an inter-protrusion pitch of 200 nanometers (nm) A dot-and-dash line indicates a reflectance characteristic as a function of wavelength in a pixel having a light-receiving surface having the moth-eye structure, the pixel having an inter-protrusion pitch of 100 nanometers (nm).

As illustrated in FIG. 8, the moth-eye structure is lower in reflectance than the flat structure. In addition, for the moth-eye structure, the pixel having the inter-protrusion pitch of 200 nanometers (nm), is lower in reflectance than the pixel having the inter-protrusion pitch of 100 nanometers (nm).

Figure 9:
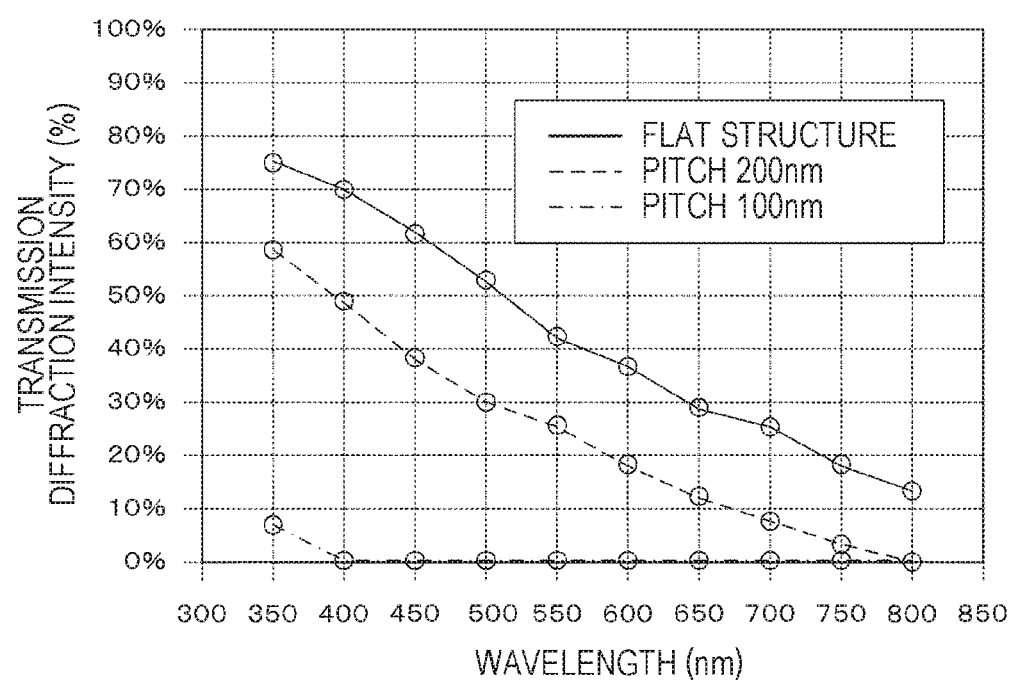
FIG. 9 is a graph of an exemplary relationship between transmission diffraction intensity and wavelength according to the first embodiment of the present technology.

FIG. 9 is a graph of an exemplary relationship between transmission diffraction intensity and wavelength according to the first embodiment. In the figure, the vertical axis represents the transmission diffraction intensity and the horizontal axis represents the wavelength. In addition, a solid line indicates a transmission diffraction intensity characteristic as a function of wavelength in the pixel having the flat light-receiving surface, and a dotted line indicates a transmission diffraction intensity characteristic as a function of wavelength in the pixel having the light-receiving surface having the moth-eye structure, the pixel having the inter-protrusion pitch of 200 nanometers (nm). A dot-and-dash line indicates a transmission diffraction intensity characteristic as a function of wavelength in the pixel having the light-receiving surface having the moth-eye structure, the pixel having the inter-protrusion pitch of 100 nanometers (nm).

As illustrated in FIG. 9, for the moth-eye structure, the pixel having the inter-protrusion pitch of 200 nanometers (nm) is higher in transmission diffraction intensity than the pixel having the inter-protrusion pitch of 100 nanometers (nm).

As illustrated in FIGS. 8 and 9, as the inter-protrusion pitch is larger, the reflectance decreases and the transmission diffraction intensity increases. Thus, in order to satisfy the conditions, such as the reflectance, required by a system, the inter-protrusion pitch is determined on the basis of the characteristics of FIGS. 8 and 9, Expression 1, and Expression 2.

Figure 10:
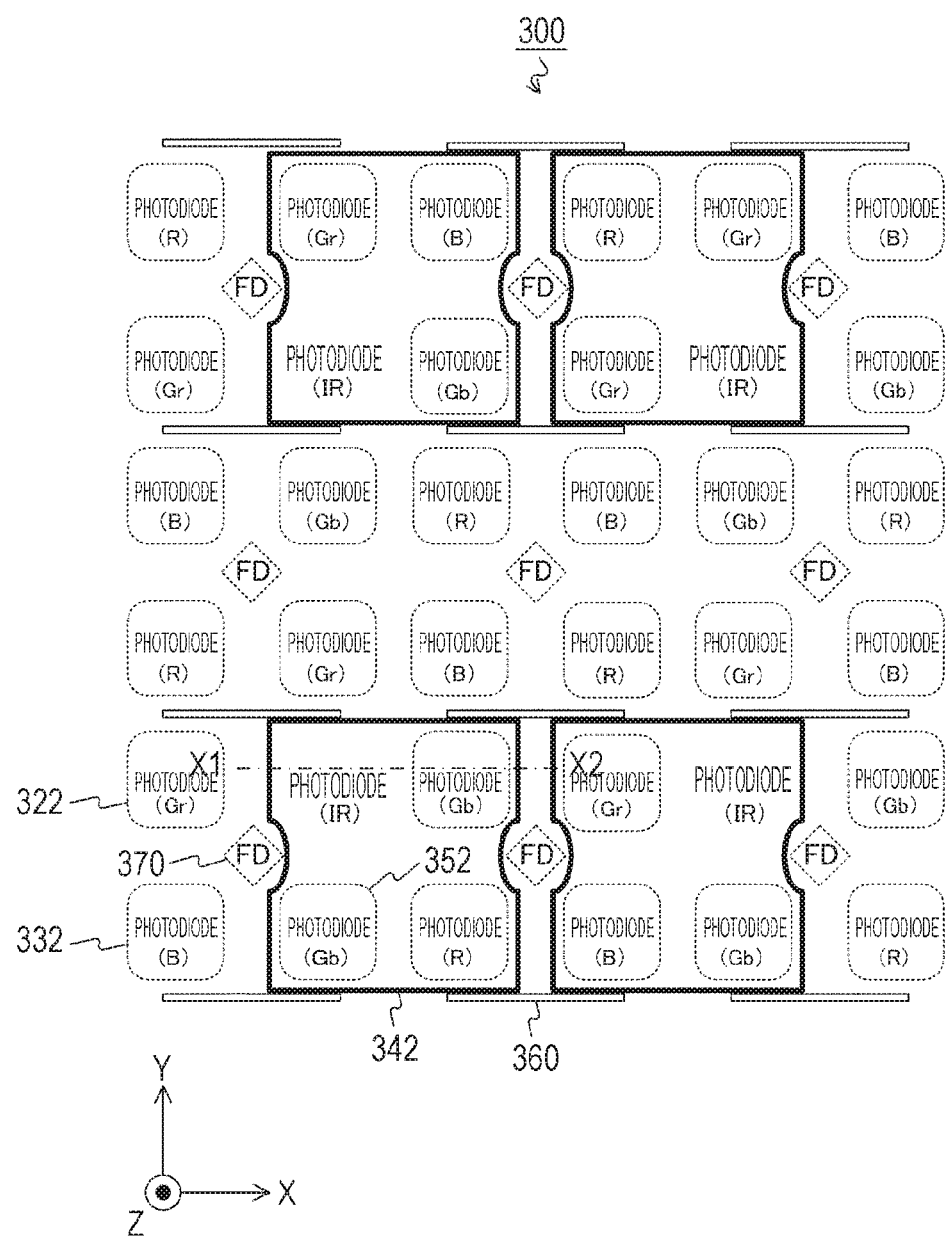
FIG. 10 is an exemplary top view of the pixel array unit indicating the region of each photodiode according to the first embodiment of the present technology.

FIG. 10 is an exemplary top view of the pixel array unit 300 indicating the region of each photodiode according to the first embodiment. In the figure, each portion surrounded by a bold solid line indicates the region of the photodiode 342 in the IR pixel. In addition, regions each surrounded by a dotted line indicate the regions of the photodiodes 322, 332, and 352 of the visible-light pixels, and the region of the floating diffusion layer 370. Two visible-light pixels are arranged between the adjacent IR pixels 340 in the X direction or the Y direction in parallel to the light-receiving surface.

The region of the photodiode 342 in the IR pixel expands beneath the respective photodiodes of the adjacent Gr pixel, Gb pixel, and B pixel, avoiding the floating diffusion layers 370. This arrangement can improve the sensitivity of the IR pixel in comparison to no expansion.

Figure 11:
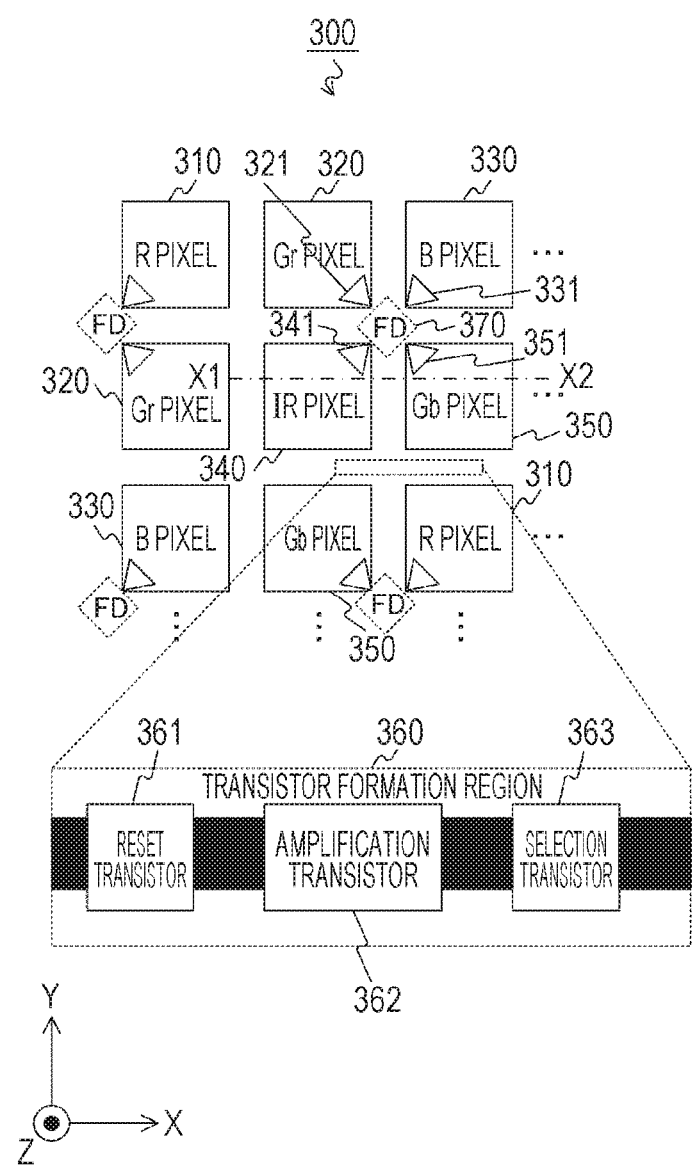
FIG. 11 is an exemplary top view of the pixel array unit indicating the position of transistors according to the first embodiment of the present technology.

FIG. 11 is an exemplary top view of the pixel array unit indicating the position of the transistors according to the first embodiment. A floating diffusion layer 370 is common between four pixels, and the transfer transistors 321, 331, 341, and 351 are provided to the pixels. In addition, the reset transistor 361, the amplification transistor 362, and the selection transistor 363 common between the four pixels, are provided in the transistor formation region 360 in the pixel separation region.

[Method of Manufacturing Solid-State Image Pickup Element]

Figure 12A:
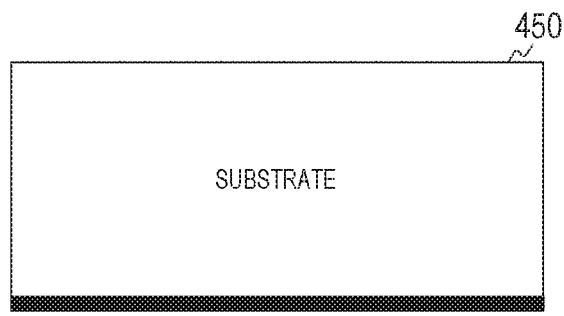
FIGS. 12A, 12B, and 12C illustrate the descriptions of a manufacturing process of forming an n+ layer and a pixel separation region according to the first embodiment of the present technology.
Figure 12B:
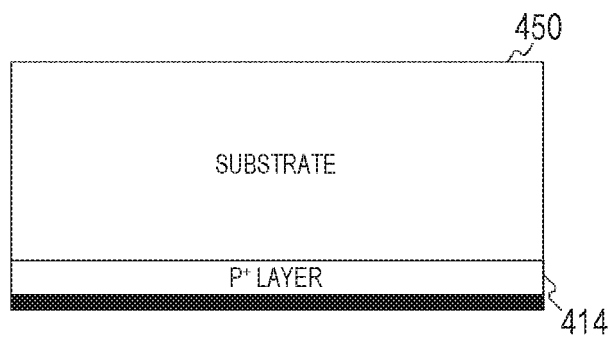
Figure 12C:
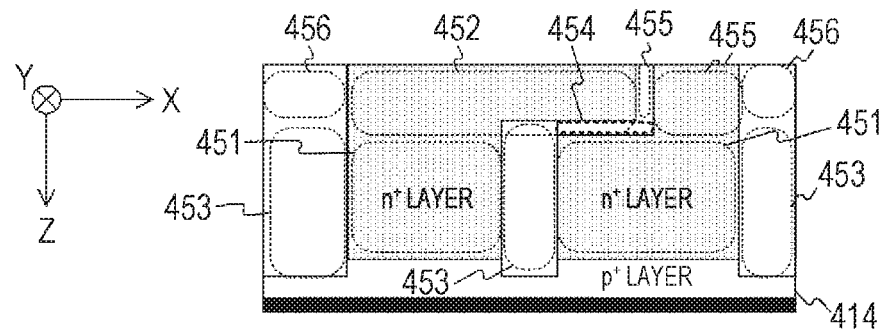

FIGS. 12A, 12B, and 12C illustrate the descriptions of a manufacturing process of forming the n+ layer and the pixel separation region according to the first embodiment. FIG. 12A is an exemplary sectional view of a silicon on insulator (SOI) substrate 450 mounted on the manufacturing device for the solid-state image pickup element 200. In FIG. 12A, a region filled in black indicates an oxide film, such as silicon dioxide (SiO2). As illustrated in FIG. 12B, the p+ layer 414 is formed by, for example, boron implantation in the vicinity of the oxide film. Then, as illustrated in FIG.

12C, the n+ layer, the pixel separation region, and the accumulation portion are formed.

The n+ layer, the pixel separation region, and the accumulation portion are formed by a plurality of processes. With the oxide film downward, the lower portion 451 of the n+ layer is first formed, and next the upper portion 452 of the n+ layer is formed. The lower portion 451 excludes an expanded portion of the n+ layer on the visible-light pixel side. Meanwhile, the upper portion 452 includes the expanded portion of the n+ layer on the visible-light pixel side. Then, the lower portion 453 of the pixel separation region is formed and next the lower portion 454 of the accumulation portion is formed. Next, the upper portion 455 of the accumulation portion and the upper portion 456 of the pixel separation region are formed.

Figure 13A:
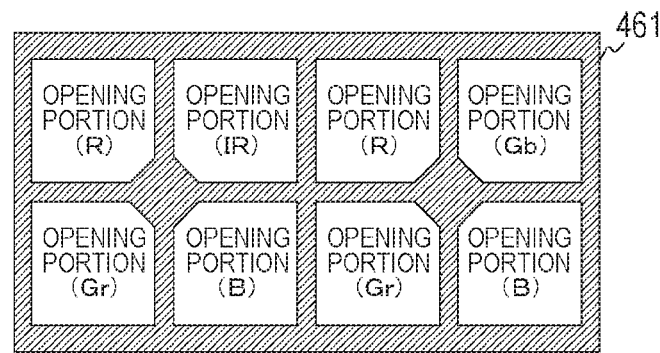
FIGS. 13A, 13B, and 13C illustrate exemplary masks for forming the n+ layer and the pixel separation region according to the first embodiment of the present technology.
Figure 13B:
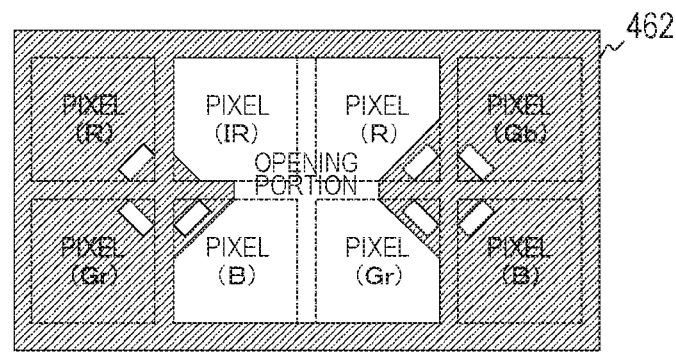
Figure 13C:
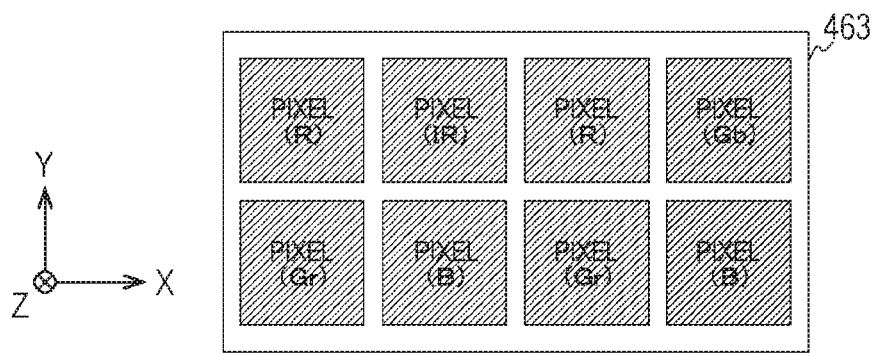

FIGS. 13A, 13B, and 13C illustrate exemplary masks for forming the n+ layer and the pixel separation region according to the first embodiment. FIG. 13A is a plan view of a mask 461 for forming the lower portion 451 of the n+ layer, and FIG. 13B is a plan view of a mask 462 for forming the upper portion 452 of n+ layer. FIG. 13C is a plan view of a mask 463 for forming the lower portion 453 of the pixel separation region. In the figure, solid-white portions each indicate an opening portion.

The mask 461 has openings for regions of the pixels. Through the mask 461, for example, the manufacturing device implants phosphorus for 5E11 number per square centimeter (cm2) with irradiation of an ion beam at 3 megaelectron volts (MeV). Alternatively, the manufacturing device implants phosphorus for 1E12 number per square centimeter (cm2) with irradiation of an ion beam at 2.5 megaelectron volts (MeV). This process forms the lower portion 451 of the n+ layer.

The mask 462 has openings for regions including the adjacent four pixels. Through the mask 462, for example, the manufacturing device implants phosphorus for 5E12 number per square centimeter (cm2) with irradiation of an ion beam at 1.0 megaelectron volt (MeV). This process forms the upper portion 452 of the n+ layer.

The mask 463 has an opening for the region between the pixels. Through the mask 463, for example, the manufacturing device implants boron for 3E12 number per square centimeter (cm2) with irradiation of an ion beam at 1.0 megaelectron volt (MeV). This process forms the lower portion 453 of the pixel separation region.

Figure 14A:
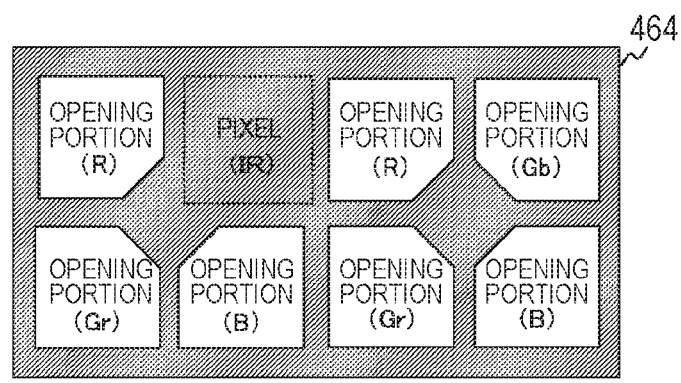
FIGS. 14A and 14B illustrate exemplary masks for forming a region of separating the n+ and the pixel separation region according to the first embodiment of the present technology.
Figure 14B:
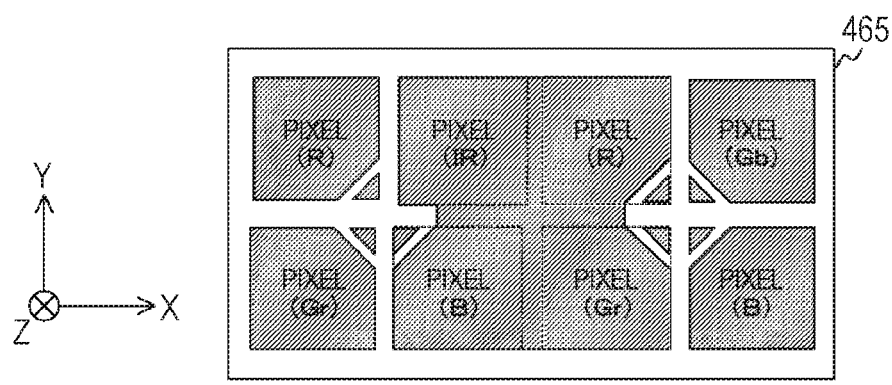

FIGS. 14A and 14B illustrate exemplary masks for forming a region of separating the n+ and the pixel separation region according to the first embodiment. FIG. 14A is a plan view of a mask 464 for forming the p+ region 454 that separates the n+ up and down, and FIG. 14B is a plan view of a mask 465 for forming the p+ region 455 that separates the n+ vertically and the upper portion 456 of the pixel separation region. In the figure, solid-white portions each indicate an opening portion.

The mask 464 has openings for regions of the visible-light pixels. Through the mask 464, for example, the manufacturing device implants boron for 5E12 number per square centimeter (cm2) with irradiation of an ion beam at 0.7 megaelectron volt (MeV). This process forms the lower portion 454 of the accumulation portion.

The mask 465 has an opening for part of the region between the pixels, the region of the IR pixel, and the visible-light pixels. Through the mask 465, for example, the manufacturing device implants boron for 5E12 number per square centimeter (cm2) with irradiation of an ion beam at 0.4 megaelectron volt (MeV). This process forms the upper portion 455 of the accumulation portion and the upper portion 456 of the pixel separation region. Then, the manufacturing device activates the impurity elements with annealing treatment at an annealing temperature of 1000° C.

FIGS. 15A, 15B, and 15C illustrate the descriptions of a manufacturing process of forming the transistors and the floating diffusion layer according to the first embodiment. After the formation of the n+ layer, the pixel separation region, and the accumulation portion, the manufacturing device forms a gate 457 for each transistor as illustrated in FIG. 15A and forms a side wall 458 as illustrated in FIG. 15B. Then, the manufacturing device forms the hole accumulation portion 406 being a p+ region in connection with the p+ region separating the n+ layer, and forms the floating diffusion layer 416, as illustrated in FIG. 15C. In addition, the manufacturing device forms a source and a drain for each transistor.

Figure 16A:
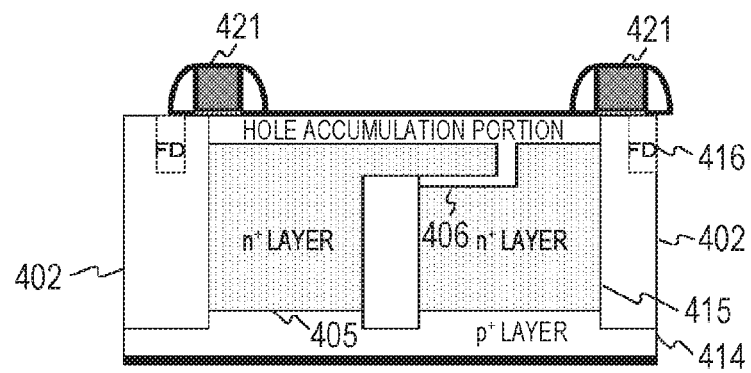
FIGS. 16A, 16B, and 16C illustrate the descriptions of a manufacturing process of forming a planarization layer and an adhesion layer according to the first embodiment of the present technology.
Figure 16B:
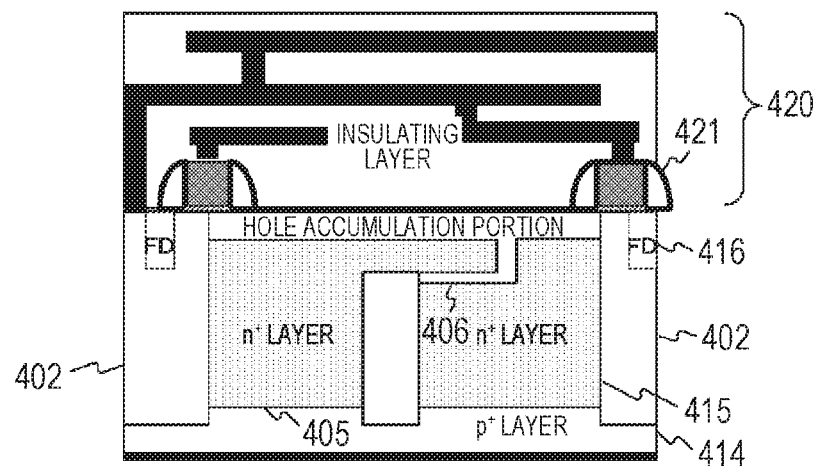
Figure 16C:
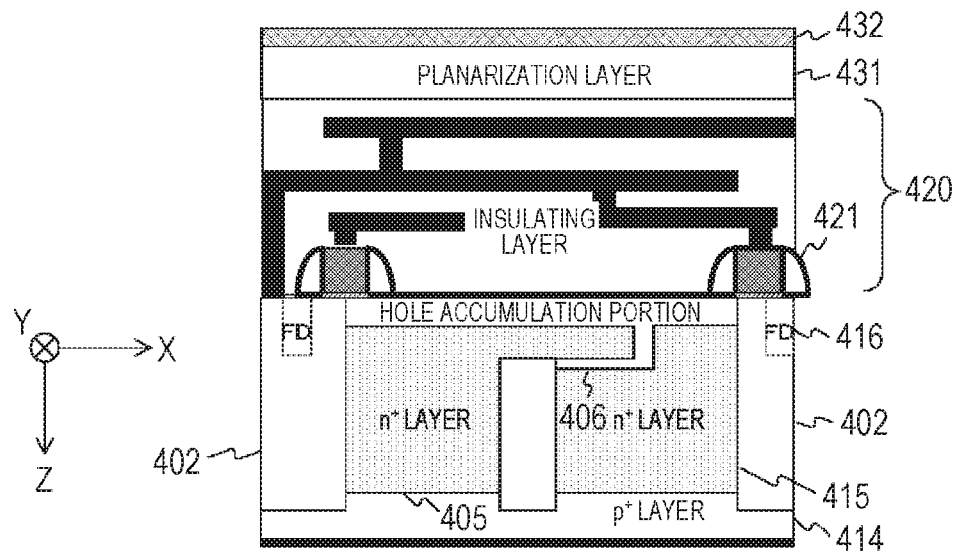

FIGS. 16A, 16B, and 16C illustrate the descriptions of a manufacturing process of forming the planarization layer and the adhesion layer according to the first embodiment. After the formation of the floating diffusion layer 416, the manufacturing device forms a salicide blocking film as illustrated in FIG. 16A. Then, the manufacturing device forms the insulating layer 420 including a wiring layer and the transistors as illustrated in FIG. 16B, and sequentially forms the planarization layer 431 and the adhesion layer 432 as illustrated in FIG. 16C. For example, titanium nitride (TiN) is formed as the adhesion layer 432 by chemical vapor deposition (CVD) method.

Figure 17A:
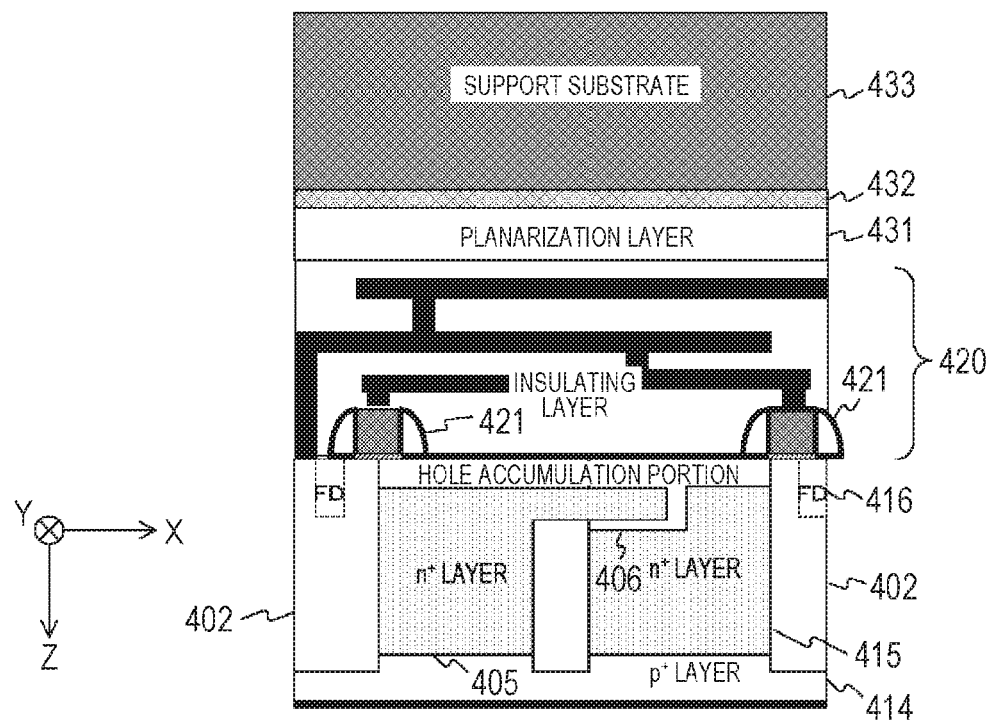
FIGS. 17A and 17B illustrate the descriptions of a manufacturing process of removing an oxide film according to the first embodiment of the present technology.
Figure 17B:
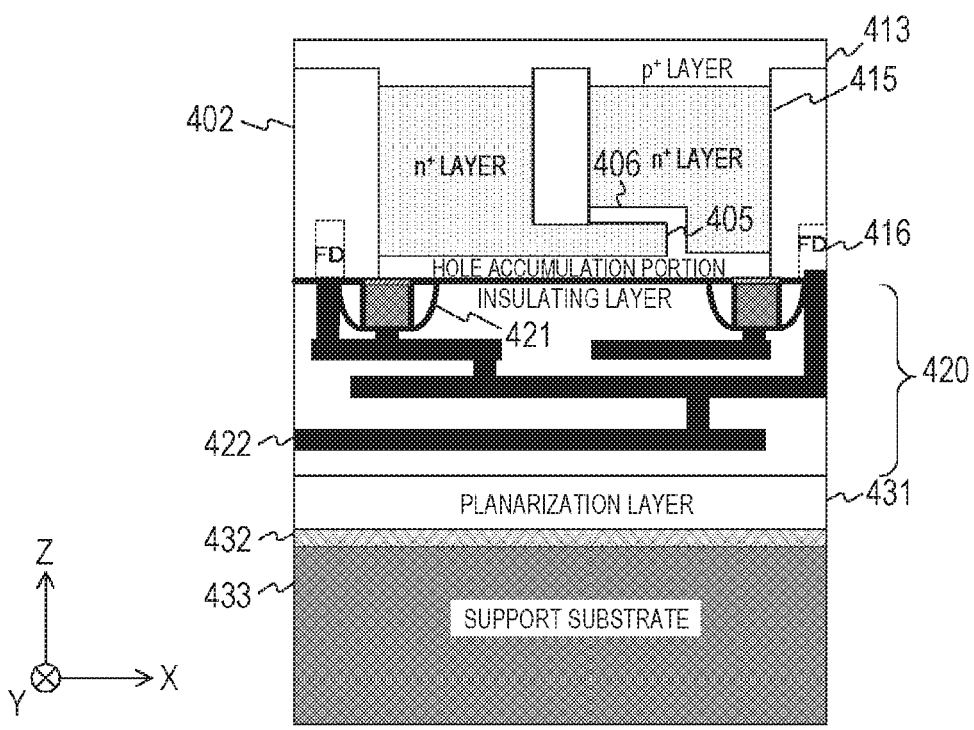

FIGS. 17A and 17B illustrate the descriptions of a manufacturing process of removing the oxide film according to the first embodiment. After the formation of the adhesion layer 432, the manufacturing device causes the support substrate 433 to adhere to the adhesion layer 432. Then, the manufacturing device turns the solid-state image pickup element 200 upside down and removes the oxide film to expose the p+ layer 414, as illustrated in FIG. 17B.

Figure 18A:
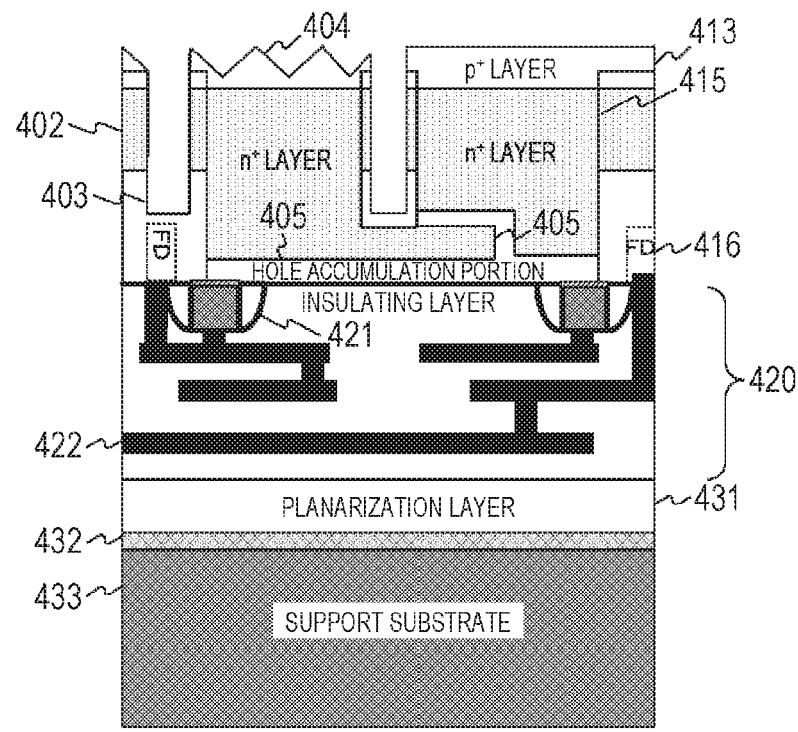
FIGS. 18A and 18B illustrate the descriptions of a manufacturing process of filling an oxide film according to the first embodiment of the present technology.
Figure 18B:
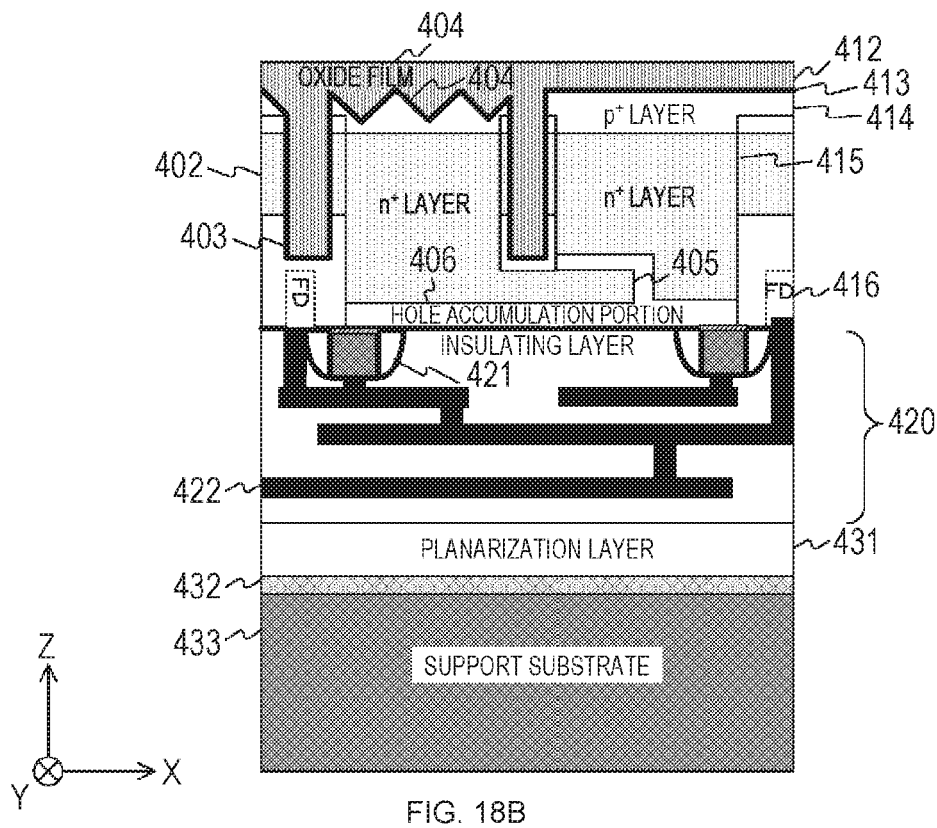

FIGS. 18A and 18B illustrate the descriptions of a manufacturing process of filling the oxide film according to the first embodiment. After the removal of the oxide film on the SIO substrate, the manufacturing device forms the moth-eye structure to the p+ layer 404 on the IR pixel and next forms the trench 403, as illustrated in FIG. 18A. Here, the moth-eye structure is formed by, for example, a method described in Japanese Patent Application Laid-Open No. 2013-033864. In the method, the moth-eye structure is formed by wet etching with a mask having a dotted resist pattern that covers the apex portions of the protrusions.

After the formation of the moth-eye structure, the manufacturing device forms the trench 403 with dry etching with a sulfur hexafluoride (SF6)/octafluorocyclobutane (C4F8) gas. The dry etching uses a resist mask subjected to resist patterning such that the resist mask has respective openings for portions of the pixel separation region. The size of each opening portion of the resist mask is set to, for example, 200 nanometers (nm). The interface of the grooved region desirably has the p+ layer including holes, in order to inhibit the dark current due to the interface.

Figure 19:
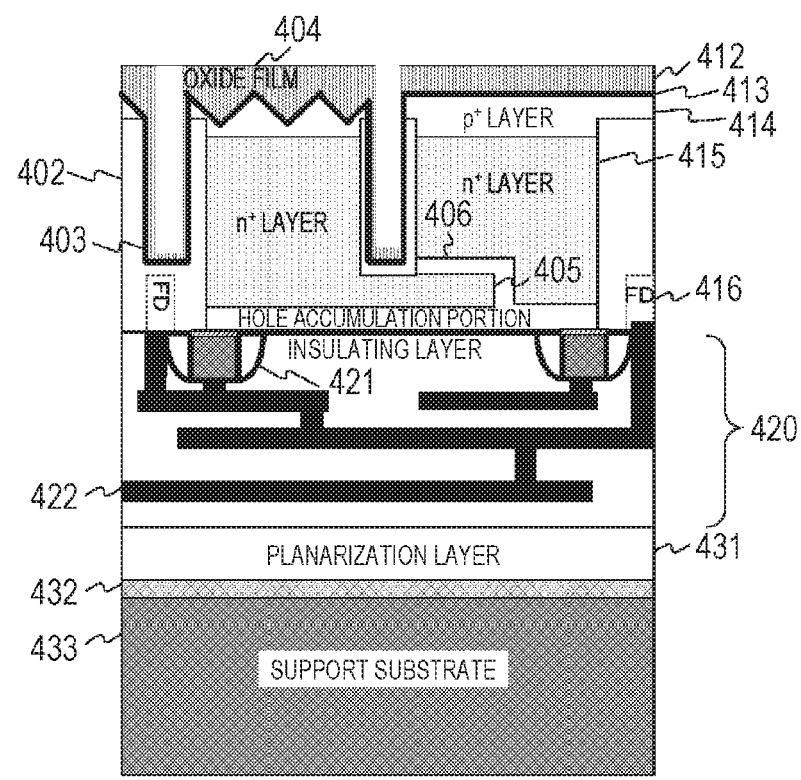
FIG. 19 is a view for describing a manufacturing process until just before burying of metal according to the first embodiment of the present technology.

Next, the manufacturing device deposits the fixed charged membrane 413 on the interface, as illustrated in FIG. 19. For example, Al2O3 is deposited as the fixed charged membrane 413 by atomic layer deposition (ALD) method. Then, the manufacturing device isotropically deposits the oxide film 412 being an insulating film lower in refractive index than silicon, to occlude the inside of the trench 403. The thickness of the oxide film 412 is, for example, 50 nanometers (nm). Note that, after the deposition of the fixed charged membrane 413, the manufacturing device may further deposit a film for optimization in reflectance, onto the light-receiving surface with a physical vapor deposition (PVD) method.

Then, the metal, such as tungsten (W) or aluminum (Al), is buried by the CVD method, so that the pixel array unit 300 having the section illustrated in FIG. 5 is manufactured. Next, the optical filters and the on-chip lens are formed, so that the pixel array unit 300 having the section illustrated in FIG. 6 is completed.

Figure 20:
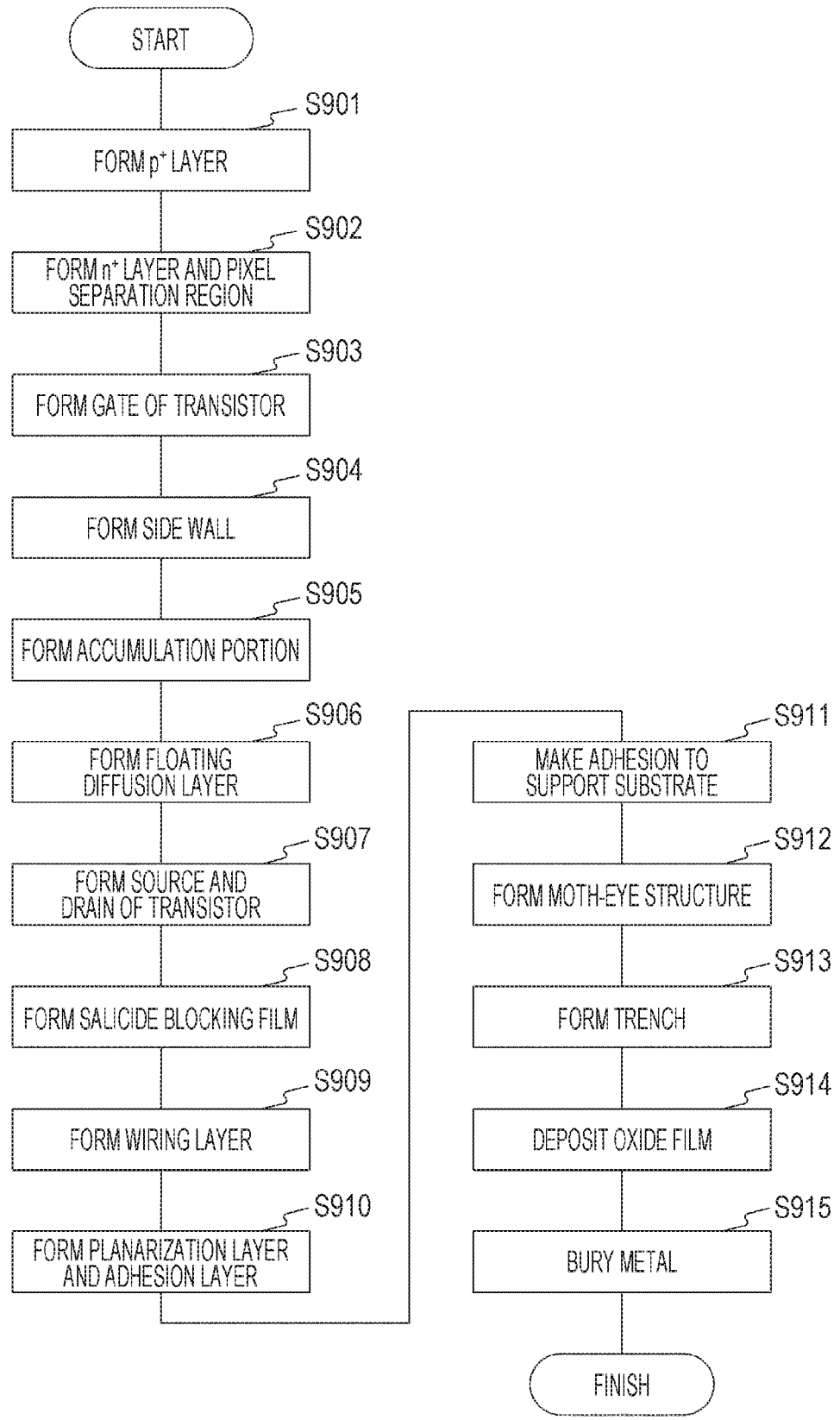
FIG. 20 is a flowchart of an exemplary method of manufacturing the pixel array unit according to the first embodiment of the present technology.

FIG. 20 is a flowchart of an exemplary method of manufacturing the pixel array unit 300 according to the first embodiment. When the SOI substrate is mounted, the manufacturing device forms the P+ layer in the vicinity of the oxide film (step S901). Then, the manufacturing device forms the n+ layer and the pixel separation region with the plurality of masks (step S902).

Next, the manufacturing device generates the gate of each transistor (step S903), and forms the side wall (step S904). Then, the manufacturing device forms the accumulation portion that accumulates electric charge (Step S905), and forms the floating diffusion layer (step S906). In addition, the manufacturing device forms the source and drain of each transistor (step S907), and forms the salicide blocking film (step S908).

Subsequently, the manufacturing device forms the wiring layer (step S909), and forms the planarization layer and the adhesion layer (step S910). The manufacturing device makes the adhesion to the support substrate (step S911), and forms the moth-eye structure to the IR pixel with, for example, the wet etching (step S912). Then, the manufacturing device forms the trench around the IR pixel with, for example, the dry etching (step S913), and deposits the oxide film (step S914). Next, the manufacturing device buries the metal in the trench (step S915) and performs the remaining processing, such as the formation of the on-chip lens, to finish the manufacturing of the pixel array unit.

In this manner, according to the first embodiment of the present technology, the formation of the plurality of protrusions on the light-receiving surface of an IR pixel 340 and the burying of the metal in the trench around the IR pixel 340 enable the reflectance on the light-receiving surface, to be reduced and the metal to absorb the light leaking from the IR pixel 340. The reduction of the reflectance enables the sensitivity of the IR pixel 340 to improve. In addition, the absorption of the leaking light can prevent the color mixture between the wavelength of the light leaking from the IR pixel 340 to the adjacent visible-light pixels and the wavelength of the incident light on each of the adjacent visible-light pixels.

[First Modification]

According to the first embodiment, the manufacturing device forms the moth-eye structure in the region including the entire light-receiving surface of an IR pixel 340 and trims part of the protrusions astride the boundary between the IR pixel 340 and the pixel separation region, to form the trench. However, the manufacturing method has a risk that a defect may occur in trimming the part of the protrusions. Thus, the manufacturing device desirably forms the moth-eye structure such that no protrusions are astride the boundary between the IR pixel 340 and the pixel separation region. For example, the moth-eye structure is required at least to be formed only in a partial region arranged at the center of the IR pixel 340. A pixel array unit 300 according to a first modification of the first embodiment is different from that according to the first embodiment in that a moth-eye structure is formed only in a partial region at the center of an IR pixel 340.

Figure 21:
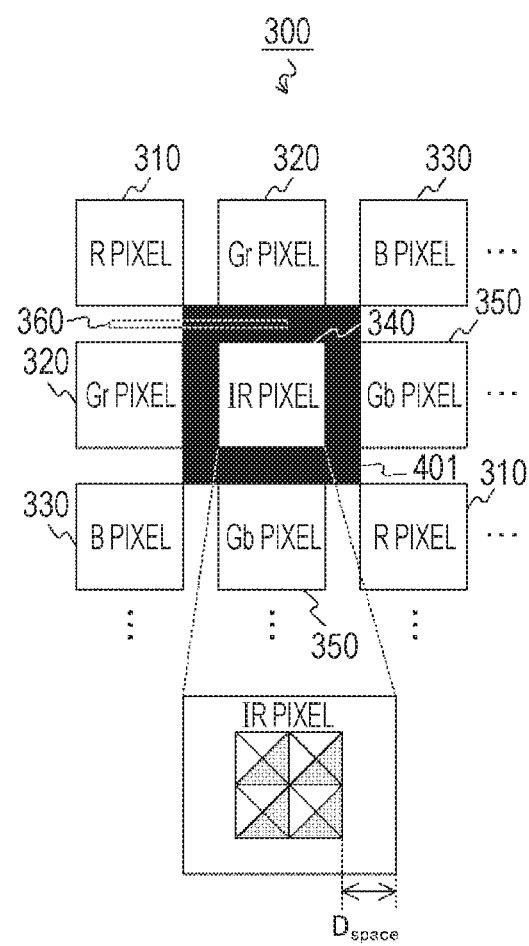
FIG. 21 is an exemplary top view of a pixel array unit according to a first modification of the first embodiment of the present technology.

FIG. 21 is an exemplary top view of the pixel array unit 300 according to the first modification of the first embodiment. The pixel array unit 300 according to the first modification is different from that according to the first embodiment in that the moth-eye structure is formed only in the partial region at the center on the light-receiving surface of the IR pixel 340. The remaining portion of the IR pixel 340 has a flat structure similarly to visible-light pixels.

Note that, the moth-eye structure is formed at the center of the IR pixel 340, but the moth-eye structure may be formed at any location except the center. The incident angle of a principal ray varies depending on the position of the IR pixel 340 in the pixel array unit 300. For example, the incident angle is small at the right end or left end of the pixel array unit 300, but is large near the center of the pixel array unit 300. As a result, the incident position of the principal ray varies between the center and end portion of the pixel array unit 300. The position to be provided with the moth-eye structure, is required at least to be changed in accordance with the incident position. For example, an IR pixel 340 near the center of the pixel array unit 300 has the moth-eye structure formed at the center of the pixel. Meanwhile, an IR pixel 340 near the end portion of the pixel array unit 300 has the moth-eye structure formed at a position such as the right end or the left end.

In this manner, according to the first modification of the first embodiment of the present technology, the plurality of protrusions is formed in the partial region of the IR pixel 340, and thus the manufacturing device does not need to trim part of the protrusions in forming a trench. This arrangement can inhibit a defect from occurring.

[Second Modification]

According to the first embodiment, the metal 401 is buried in the trench 403 around an IR pixel 340, but a member different from the metal 401 (e.g., oxide film 412) can be buried in the trench as a member that reflects light. A pixel array unit 300 according to a second modification of the first embodiment is different from that according to the first embodiment in that a member different from the metal 401 is buried in a trench 403.

Figure 22:
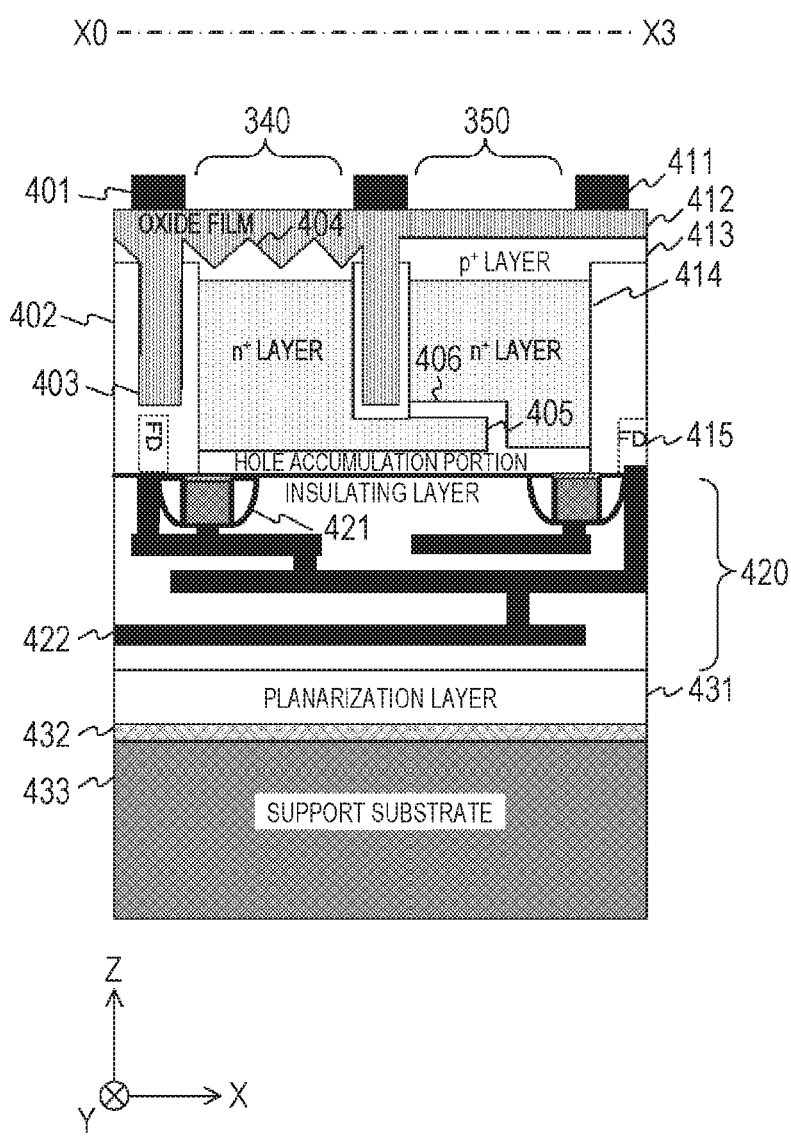
FIG. 22 is an exemplary sectional view of a pixel array unit according to a second modification of the first embodiment of the present technology.

FIG. 22 is an exemplary sectional view of the pixel array unit 300 according to the second modification of the first embodiment. The pixel array unit 300 according to the second modification is different from that according to the first embodiment in that an oxide film 412 is buried in the trench 403. The thickness of the oxide film 412 is, for example, 150 nanometers (nm). As described above, the oxide film 412 is lower in refractive index than silicon, and thus light leaking from an IR pixel 340 is reflected according to the Fresnel Equations, so that color mixture can be prevented. In addition, the metal 401 is arranged on the upper portion of a pixel separation region 402, without being buried in the trench 403.

[Third Modification]

According to the first embodiment, an IR pixel is arranged every two visible-light pixels in the X axis direction and the Y direction, but the number of IR pixels 340 in the pixel array unit 300 can be reduced and the number of visible-light pixels can be increased by the reduction. A pixel array unit 300 according to a third modification of the first embodiment is different from that according to the first embodiment in that the number of visible-light pixels is increased.

Figure 23:
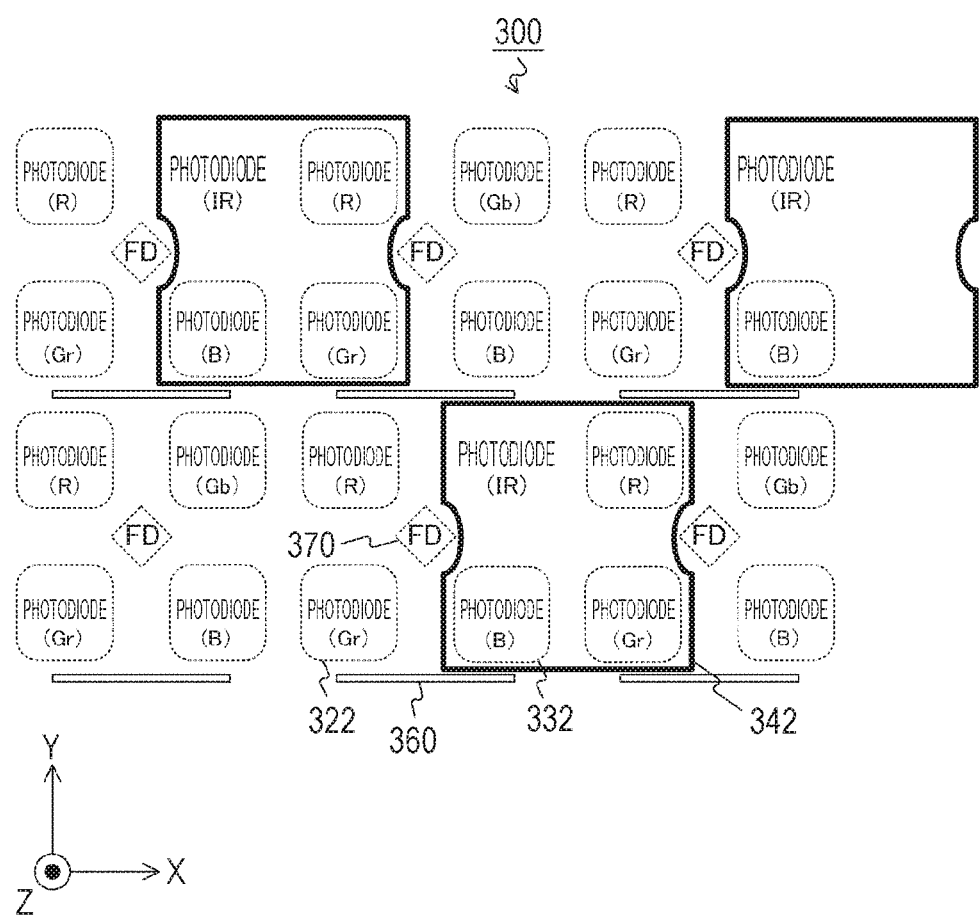
FIG. 23 is an exemplary top view of a pixel array unit indicating the region of each photodiode according to a third modification of the first embodiment of the present technology.

FIG. 23 is an exemplary top view of the pixel array unit 300 indicating the region of each photodiode according to the third modification of the first embodiment. According to the third modification, three visible-light pixels are arranged between the adjacent IR pixels 340 in the X axis direction and the Y axis direction. That is, an IR pixel is arranged every three visible-light pixels. Thus, the number of IR pixels 340 is less than that according to the first embodiment in which an IR pixel 340 is arranged every two visible-light pixels, and the number of visible-light pixels increases by the reduction. The arrangement of a photodiode 332 is changed with the change of the arrangement of the IR pixel 340. Note that, the shape and area of the photodiode 332 according to the third modification, are similar to those according to the first embodiment.

In this manner, according to the third modification of the first embodiment of the present technology, the increase of the number of visible-light pixels can improve the image quality of image data based on the visible-light pixels.

[Fourth Modification]

According to the first embodiment, four pixels share a floating diffusion layer 370 and a reset transistor 361, but two pixels can share, for example, a floating diffusion layer 370. A pixel array unit 300 according to a fourth modification of the first embodiment is different from that according to the first embodiment in that two pixels share, for example, a floating diffusion layer 370.

Figure 24:
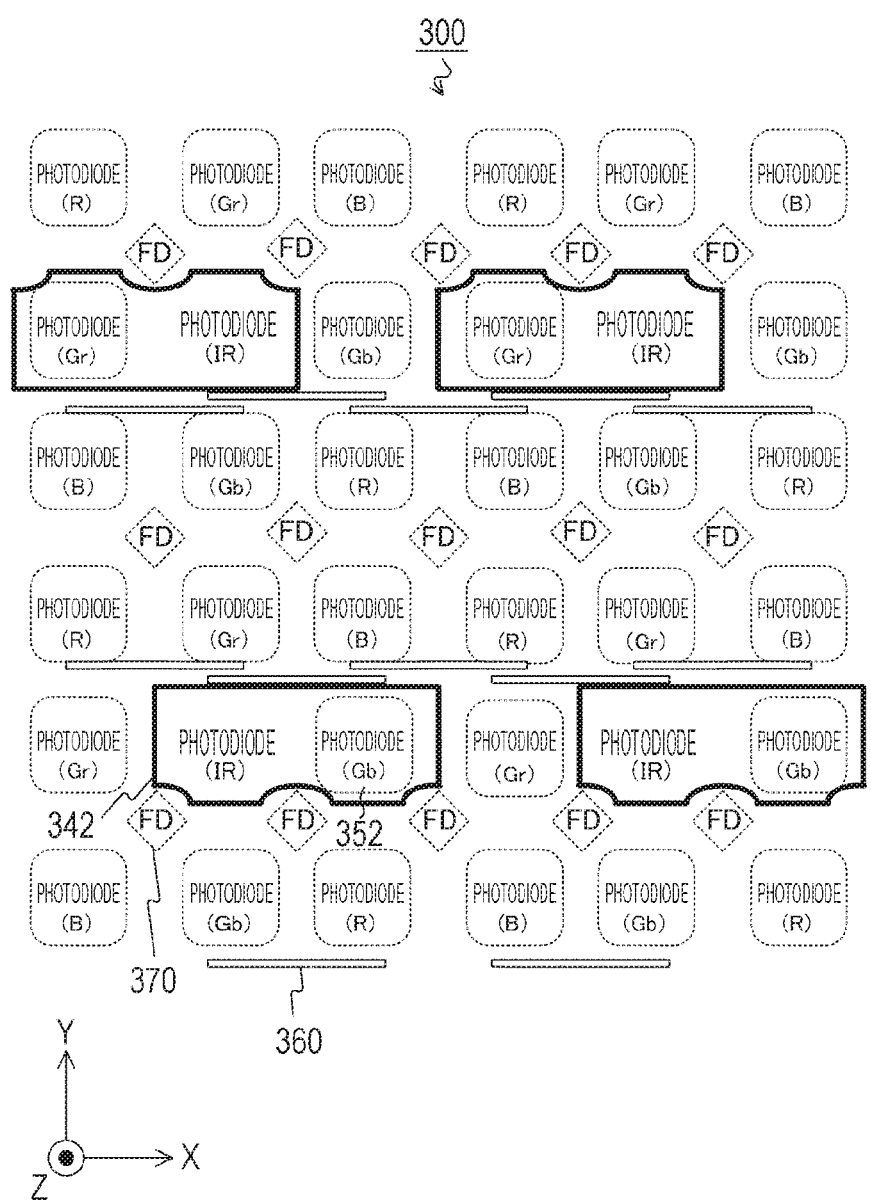
FIG. 24 is an exemplary top view of a pixel array unit indicating the region of each photodiode according to a fourth modification of the first embodiment of the present technology.

FIG. 24 is an exemplary top view of the pixel array unit indicating the region of each photodiode according to the fourth modification of the first embodiment. In the pixel array unit 300 according to the fourth modification, adjacent two pixels share a floating diffusion layer 370, and thus the number of floating diffusion layers 370 is two times that according to the first embodiment in which four pixels share. In addition, due to the increase in the number of floating diffusion layers 370, the area of a photodiode 352 formed avoiding a floating diffusion layer 370, is smaller than that according to the first embodiment.

Figure 25:
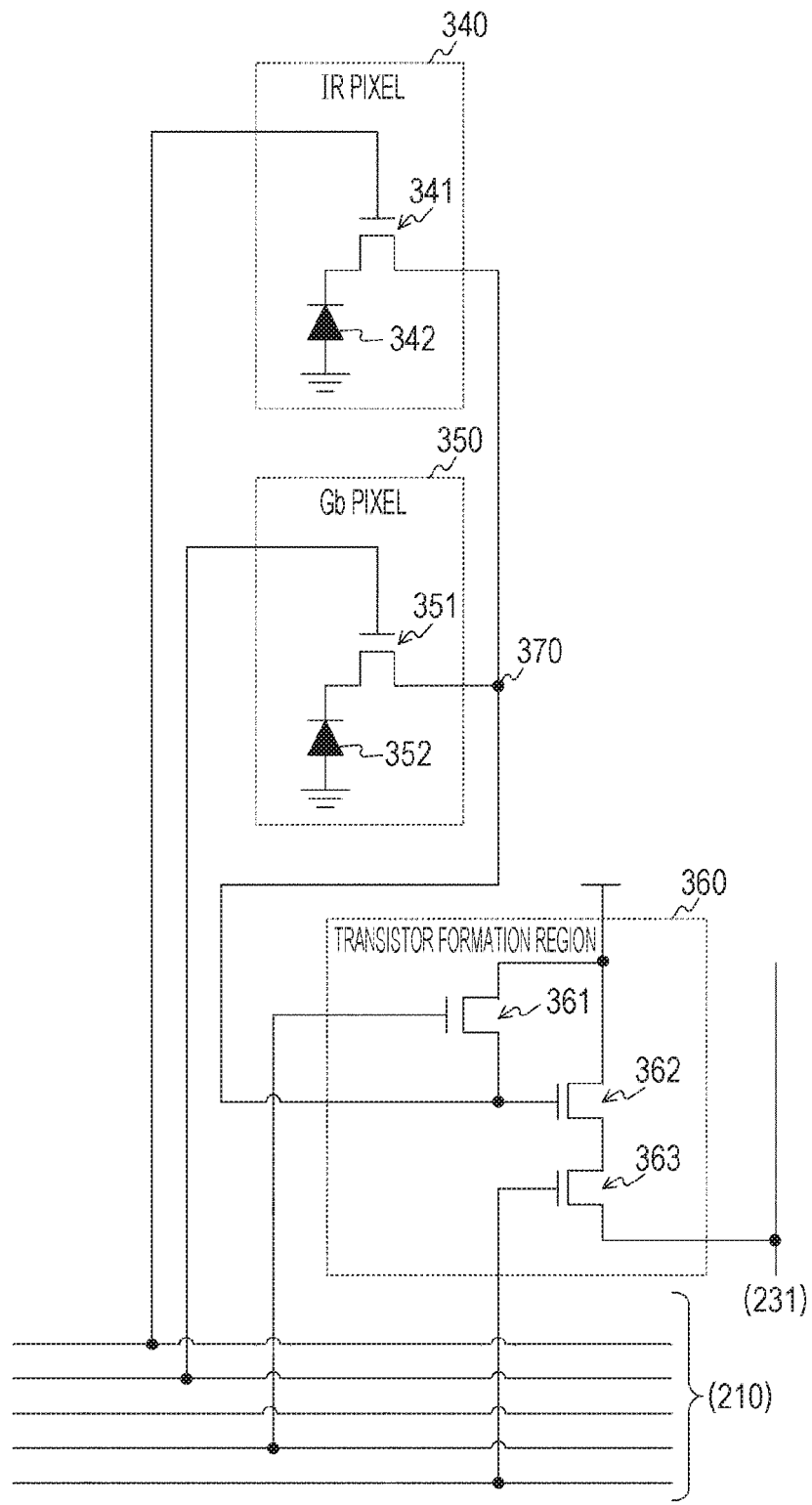
FIG. 25 is an exemplary circuit diagram of a pixel circuit according to the fourth modification of the first embodiment of the present technology.

FIG. 25 is an exemplary circuit diagram of a pixel circuit according to the fourth modification of the first embodiment. As illustrated in the figure, according to the fourth modification, two pixels, such as an IR pixel 340 and a Gb pixel 350, share a floating diffusion layer 370, a reset transistor 361, an amplification transistor 362, and a selection transistor 363. The reduction in the number of pixels sharing with each other decreases, reduces the number of times that the floating diffusion layer 370 accumulates or discharges electric charge or the number of time that the common transistors operate. This arrangement can lengthen the life span of a solid-state image pickup element 200 more than that according to the first embodiment.

In this manner, according to the fourth modification of the first embodiment of the present technology, every two pixels shares the floating diffusion layer 370 and the transistors, and thus the number of times that the floating diffusion layer 370 accumulates or discharges electric charge or the number of time that the transistors operate, can be reduced.

[Fifth Modification]

According to the first embodiment, the photodiodes of the visible-light pixels are identical to each other in depth. However, from the viewpoint of optimization in sensitivity as a function of wavelength, the depth of the photodiode of each visible-light pixel may have a value corresponding to the wavelength of light to be received by the pixel. A pixel array unit 300 according to a fifth modification of the first embodiment, is different from that according to the first embodiment in that a photodiode has a depth corresponding to the wavelength of light to be received by the pixel.

Figure 26:
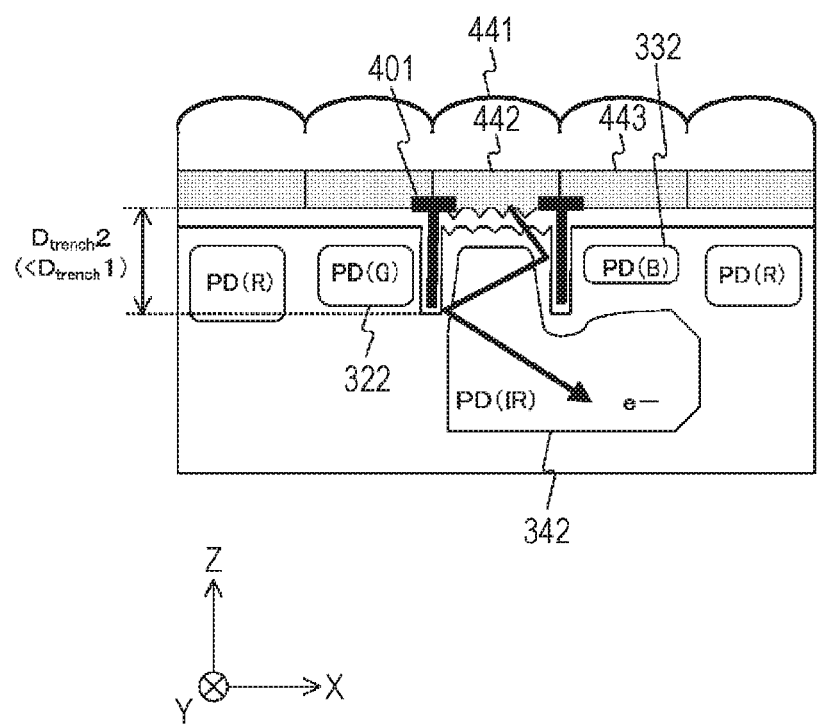
FIG. 26 is an exemplary schematic sectional view of the structure of a pixel array unit according to a fifth modification of the first embodiment of the present technology.

FIG. 26 is an exemplary schematic sectional view of the structure of the pixel array unit 300 according to the fifth modification of the first embodiment. From the viewpoint of optimization in sensitivity as a function of wavelength, the depth of a photodiode is shallow as the wavelength of light to be received is short, in the pixel array unit 300 according to the fifth modification. Specifically, the wavelength of a B pixel 330 is short, and then a G pixel 320 or 350, an R pixel 310, and an IR pixel 340 are in order of increasing wavelength. Thus, the pixel array unit 300 is formed such as the photodiode 332 of the B pixel 330 is shallowest and the photodiodes are deep in the order of the G pixel 320 or 350, the R pixel 310, and the IR pixel 340.

Then, the B pixel or the G pixel in which the depth of the photodiode is relatively shallow, is preferentially arranged at a position adjacent to the IR pixel. If the photodiodes of the visible-light pixels adjacent to the IR pixel are shallowed, a trench can be shallowed by the shallowness. The depth Dtrench2 of the trench according to the fifth modification is smaller than the depth Dtrench1 according to the first embodiment. The shallowing of the trench enables the volume of the photodiode 342 expanding beneath the trench and a visible-light pixel, to be increased.

In this manner, according to the fifth modification of the first embodiment of the present technology, a photodiode having a relatively shallow depth is arranged for a visible-light pixel adjacent to the IR pixel, and thus the volume of the photodiode 342 of the IR pixel can be increased.

[Sixth Modification]

According to the first embodiment, the moth-eye structure and the trench are formed in the back-illuminated solid-state image pickup element 200, but the moth-eye structure and the trench may be formed in a front-illuminated solid-state image pickup element 200 having a light-receiving surface on the wiring layer side. A pixel array unit 300 according to a sixth modification of the first embodiment, is different from that according to the first embodiment in that a light-receiving surface is on the wiring layer side.

Figure 27:
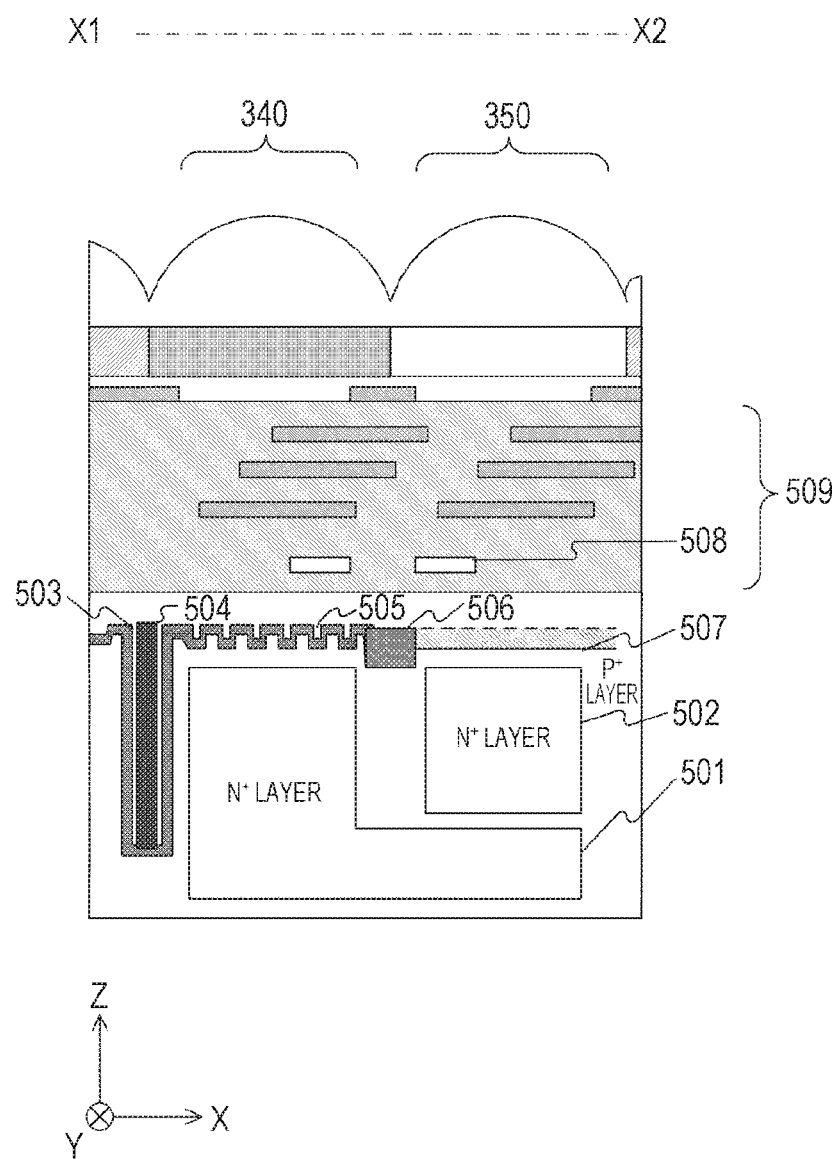
FIG. 27 is an exemplary sectional view of a pixel array unit according to a sixth modification of the first embodiment of the present technology.

FIG. 27 is an exemplary sectional view of the pixel array unit according to the sixth modification of the first embodiment. An IR pixel 340 includes an n+ layer 501 formed and the adjacent Gb pixel 350 includes an n+ layer 502 formed. The n+ layers each function as a photodiode. With the direction to the light-receiving surface, regarded as an upward direction, the n+ layer 501 expands beneath the n+ layer 502. In addition, a p+ layer 505 is formed on the upper portion of the n+ layer 501, and a p+ layer 507 is formed on the upper portion of the n+ layer 502. The p+ layer 505 has a moth-eye structure, whereas the p+ layer 507 has a flat structure. In addition, a trench 503 is formed in a pixel separation region around the IR pixel 340, and metal 504 is buried in the trench 503. In addition, a floating diffusion layer 506 is formed in the pixel separation region. In addition, an insulating layer 509 including a wiring layer is provided on the upper portions of the p+ layer 505 and the p+ layer 507, and, for example, a transfer transistor 508 is arranged in the wiring layer 509.

The configuration allows the pixels, such as the IR pixel 340, to photoelectrically convert light received through the wiring layer 509 at the front. Typically, such a front-illuminated solid-state image pickup element has no need of a process of trimming a substrate and the like, and is easier to manufacture than a back-illuminated solid-state image pickup element.

Figure 28:
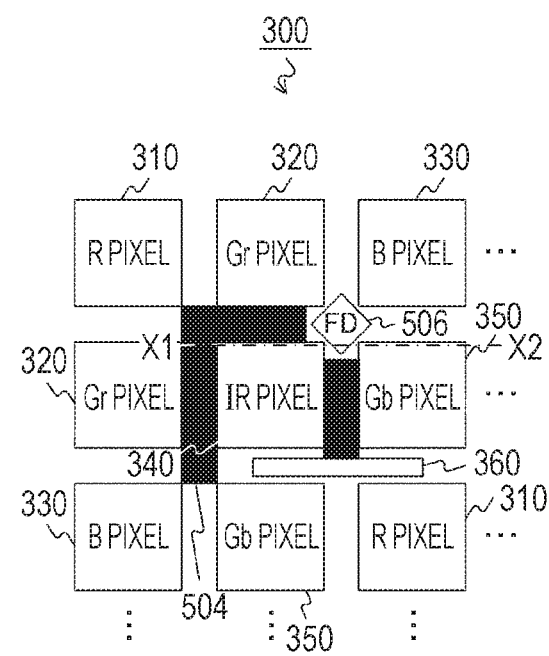
FIG. 28 is an exemplary top view of the pixel array unit according to the sixth modification of the first embodiment of the present technology.

FIG. 28 is an exemplary top view of the pixel array unit 300 according to the sixth modification of the first embodiment. The trench 503 is provided around the IR pixel 340, and the metal 504 is buried in the trench 503. Note that, the trench 503 is formed such that the trench 503 avoids the floating diffusion layer 506 and a transistor formation region 360 including, for example, a reset transistor formed therein.

In this manner, according to the sixth modification of the first embodiment of the present technology, the front-illuminated solid-state image pickup element is provided and thus can be manufactured easier than the back-illuminated solid-state image pickup element.

2. Second Embodiment

According to the first embodiment, the moth-eye structure is provided only to each IR pixel 340 and the trench is provided therearound, to improve the sensitivity of the IR pixel 340 and to prevent the light from leaking from the IR pixel 340. However, the sensitivity of each visible-light pixel may become insufficient and the light may leak from each visible-light pixel. A solid-state image pickup element 200 according to a second embodiment, is different from that according to the first embodiment in that the sensitivity of a visible-light pixel is improved and light is prevented from leaking from the visible-light pixel.

Figure 29:
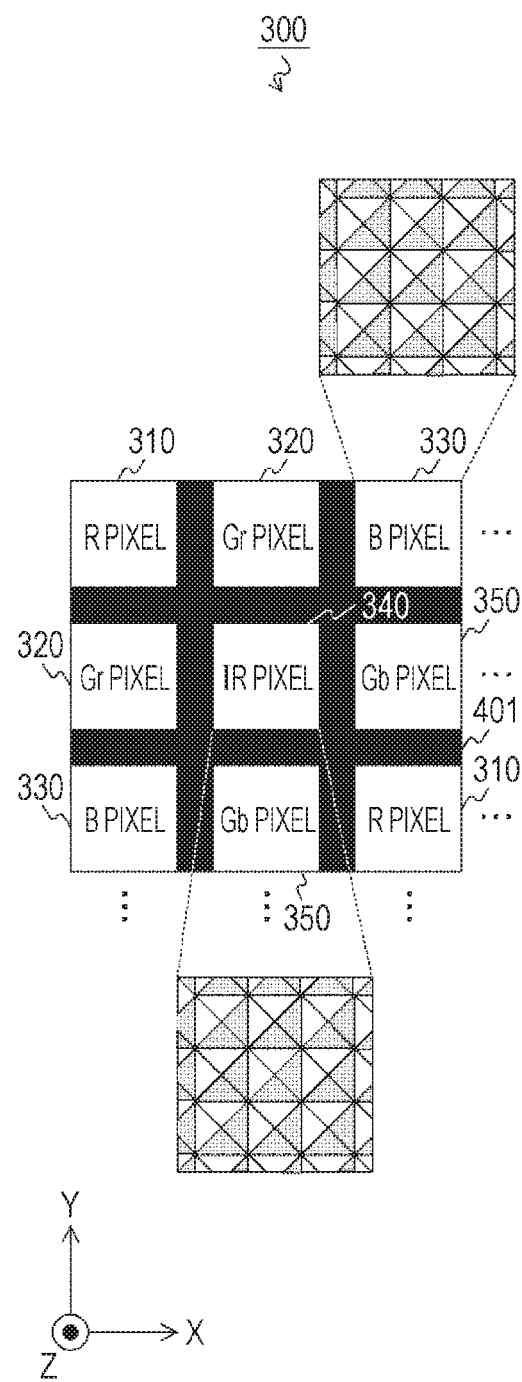
FIG. 29 is an exemplary top view of a pixel array unit according to a second embodiment of the present technology.

FIG. 29 is an exemplary top view of a pixel array unit 300 according to the second embodiment. The pixel array unit 300 according to the second embodiment, is different from that according to the first embodiment in that the light-receiving surfaces of visible-light pixels, such as a B pixel 330, each have a moth-eye structure including a plurality of protrusions formed. In addition, a trench is provided around the visible-light pixels and metal 401 is buried in the trench, differently from the first embodiment. Here, the respective inter-protrusion pitches of the pixels are the same.

Note that, all the visible-light pixels do not necessarily need to have the moth-eye structure, and the trench is not necessarily required to be formed around all the visible-light pixels. For example, only part of the visible-light pixels may have the moth-eye structure, and the trench may be formed only around the part of the visible-light pixels. A similar manner is made for the IR pixels 340.

In addition, the moth-eye structure is formed at the center of each visible-light pixel, but the moth-eye structure may be formed any location different from the center. For example, for a visible-light pixel in the vicinity of the center of the pixel array unit 300, the moth-eye structure is formed at the center of the visible-light pixel. Meanwhile, for a visible-light pixel in the vicinity of the end portion of the pixel array unit 300, the moth-eye structure is formed at the incident position of a principal ray, such as the right end or the left end. A similar manner is made for the IR pixels 340.

Figure 30:
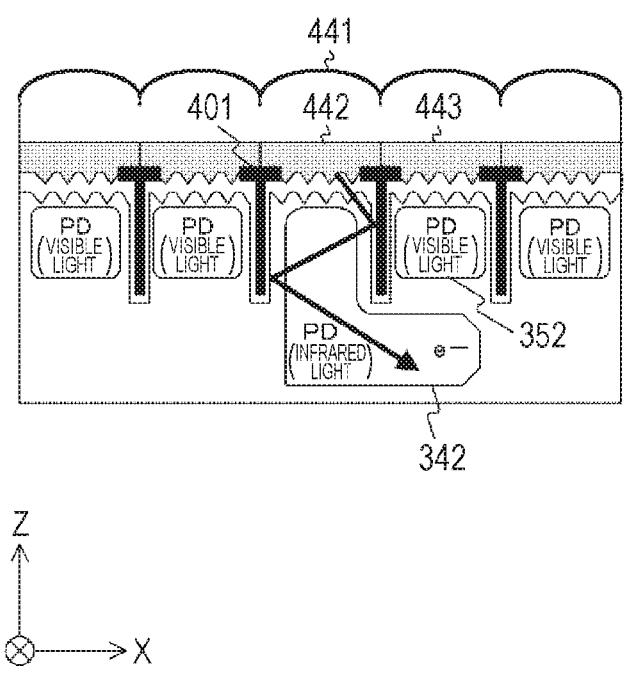
FIG. 30 is an exemplary schematic sectional view of the structure of the pixel array unit according to the second embodiment of the present technology.

FIG. 30 is an exemplary schematic sectional view of the structure of the pixel array unit 300 according to the second embodiment. The moth-eye structure of each visible-light pixel, reduces the reflectance on the light-receiving surface of the visible-light pixel, so that almost all visible light passes through the light-receiving surface. In addition, light emergent to an adjacent pixel after passing through a visible-light pixel, is shielded by the metal 401 in the trench around the visible-light pixel, so that the light is inhibited from leaking from the visible-light pixel to the adjacent pixel and color mixture is prevented.

Figure 31:
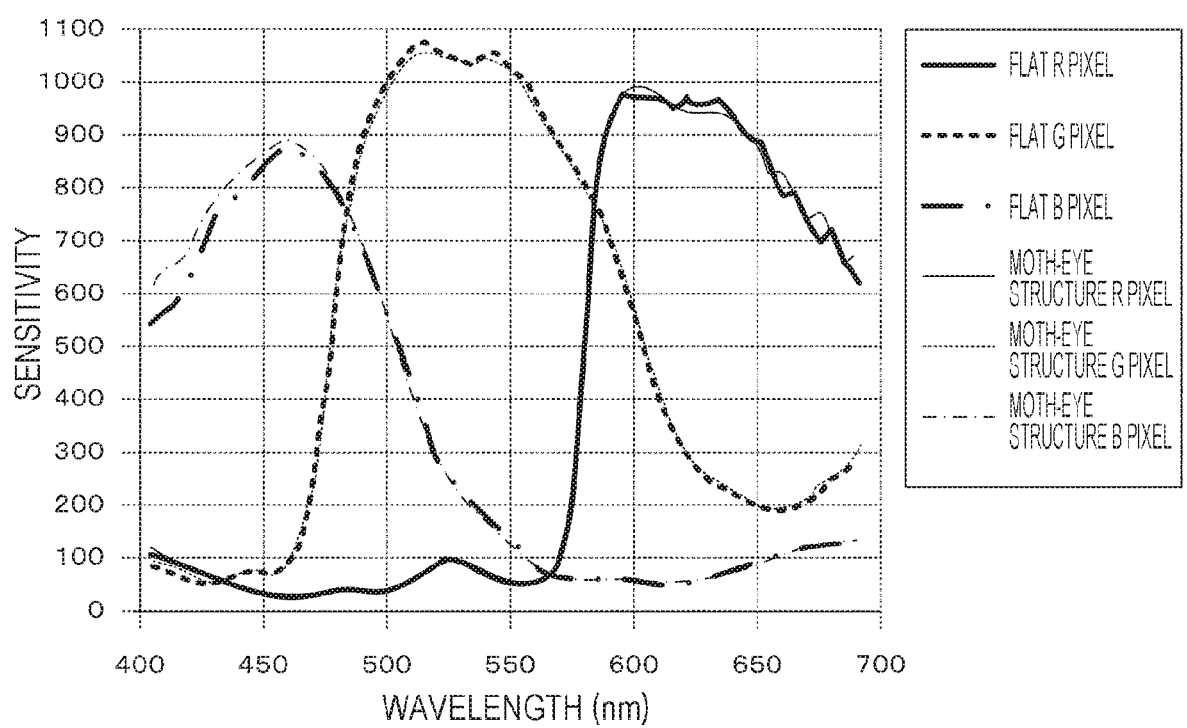
FIG. 31 is a graph of an exemplary relationship between the sensitivity of each pixel having an inter-protrusion pitch of 125 nanometers (nm) and wavelength according to the second embodiment of the present technology.

FIG. 31 is a graph of an exemplary relationship between the sensitivity of each pixel having an inter-protrusion pitch of 125 nanometers (nm) and wavelength according to the second embodiment. In the figure, the vertical axis represents the sensitivity of each pixel, and the horizontal axis represents the wavelength of light incident on each pixel. In addition, a bold solid line indicates the sensitivity of an R pixel having a flat structure as a function of wavelength, and a thin solid line indicates the sensitivity of an R pixel having the moth-eye structure as a function of wavelength. A bold dotted line indicates the sensitivity of a G pixel having the flat structure as a function of wavelength, and a thin dotted line indicates the sensitivity of a G pixel having the moth-eye structure as a function of wavelength. A bold dot-and-dash line indicates the sensitivity of a B pixel having the flat structure as a function of wavelength, and a thin dot-and-dash line indicates the sensitivity of a B pixel having the moth-eye structure as a function of wavelength. As illustrated in the figure, for the linter-protrusion pitch of 125 nanometers (nm), no large difference occurs in sensitivity between the moth-eye structure and the flat structure.

Figure 32:
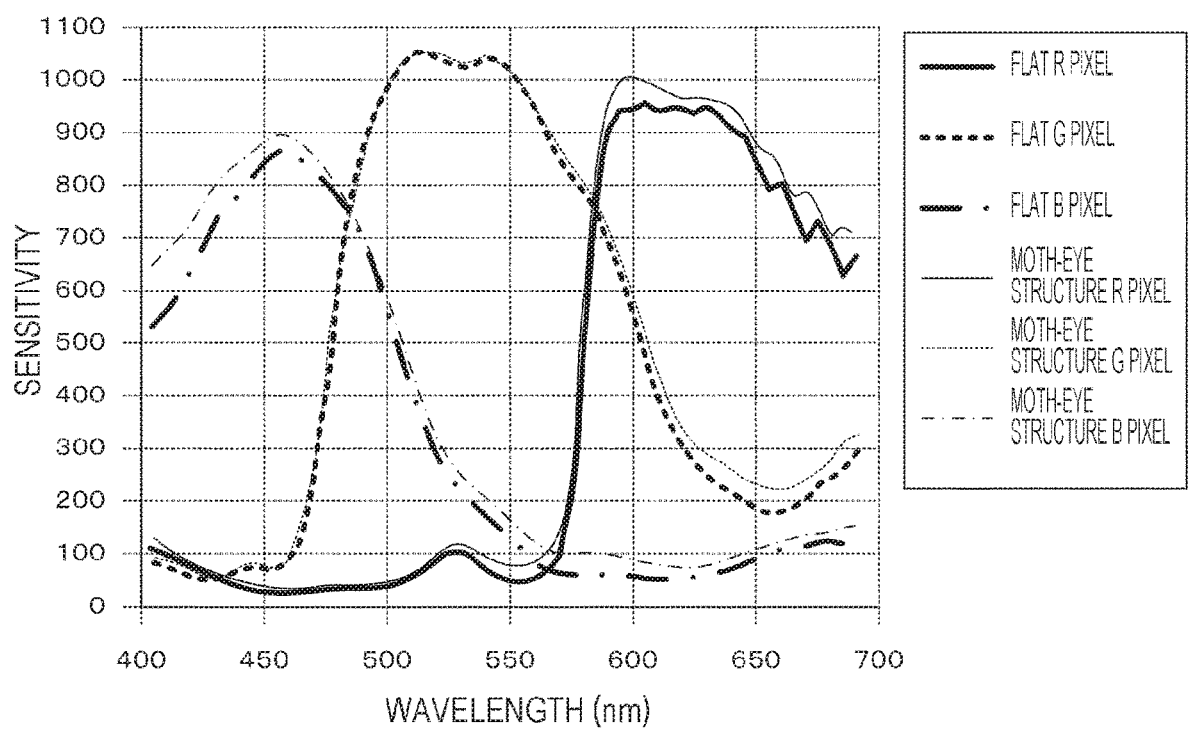
FIG. 32 is a graph of an exemplary relationship between the sensitivity of each pixel having an inter-protrusion pitch of 250 nanometers (nm) and wavelength according to the second embodiment of the present technology.

FIG. 32 is a graph of an exemplary relationship between the sensitivity of each pixel having an inter-protrusion pitch of 250 nanometers (nm) and wavelength according to the second embodiment. As illustrated in the figure, for the inter-protrusion pitch of 250 nanometers (nm), respective differences occur in sensitivity between the R pixels, between the G pixels, and between the B pixels, in comparison to the inter-protrusion pitch of 100 nanometers (nm).

Figure 33:
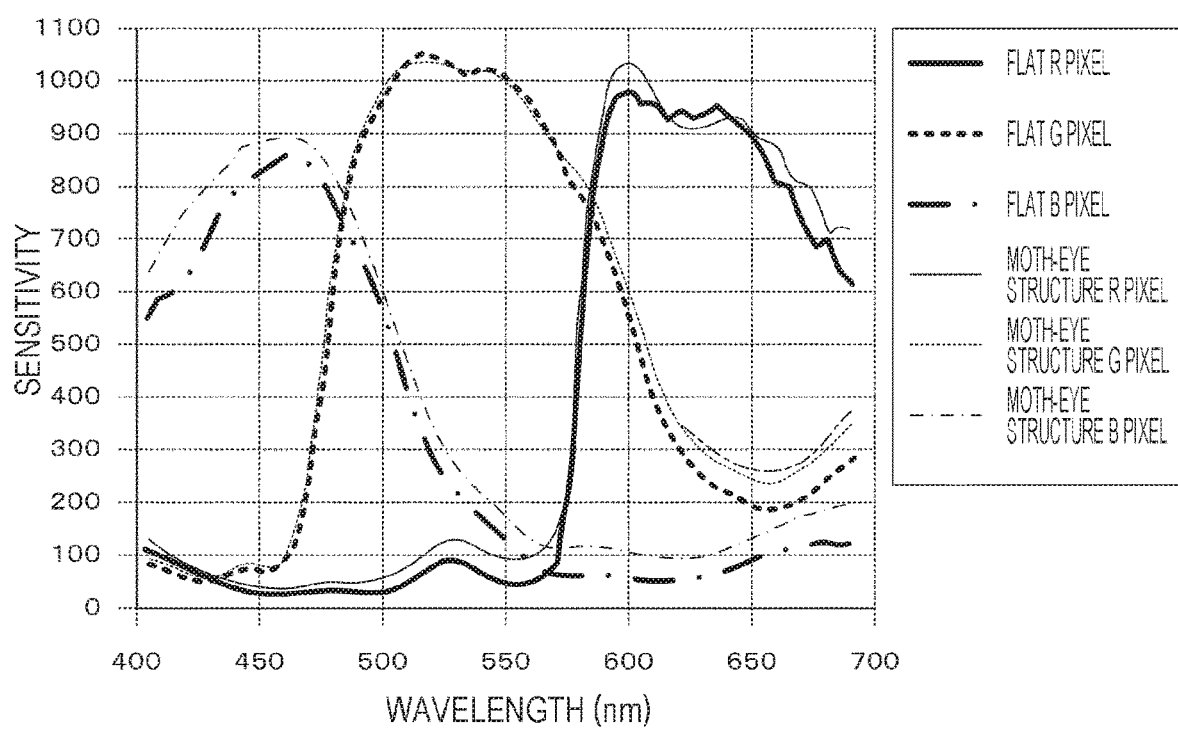
FIG. 33 is a graph of an exemplary relationship between the sensitivity of each pixel having an inter-protrusion pitch of 400 nanometers (nm) and wavelength according to the second embodiment of the present technology.

FIG. 33 is a graph of an exemplary relationship between the sensitivity of each pixel having an inter-protrusion pitch of 300 nanometers (nm) and wavelength according to the second embodiment. As illustrated in the figure, for the inter-protrusion pitch of 300 nanometers (nm), respective larger differences occur in sensitivity between the R pixels, between the G pixels, and between the B pixels, in comparison to the inter-protrusion pitch of 250 nanometers (nm).

As illustrated in FIGS. 31 to 33, if the inter-protrusion pitch is 250 nanometers (nm) or more, a sensitivity improvement effect is sufficiently acquired. Therefore, the inter-protrusion pitch is desirably 250 nanometers (nm) or more.

In this manner, according to the second embodiment of the present technology, the formation of the plurality of protrusions on the light-receiving surface of each visible-light pixel, the provision of the trench therearound, and the burying of the metal 401 enable the reflectance of each visible-light pixel to be reduced and the metal to absorb the light leaking from each visible-light pixel. The reduction in reflectance can improve the sensitivity of each visible-light pixel. In addition, the absorption of the leaking light can prevent the color mixture.

[First Modification]

According to the second embodiment, the manufacturing device forms the moth-eye structure in a region including the entire light-receiving surface of a pixel and trims part of the protrusions astride the boundary between the pixel and the pixel separation region, to form the trench. However, the manufacturing method has a risk that a defect may occur in trimming the part of the protrusions. Thus, the manufacturing device desirably forms the moth-eye structure such that no protrusions are astride the boundary between the pixel and the pixel separation region. For example, the moth-eye structure is required at least to be formed only in a partial region arranged at the center of a pixel. A pixel array unit 300 according to a first modification of the first embodiment, is different from that according to the first embodiment in that a moth-eye structure is formed only in a partial region at the center of a pixel.

Figure 34:
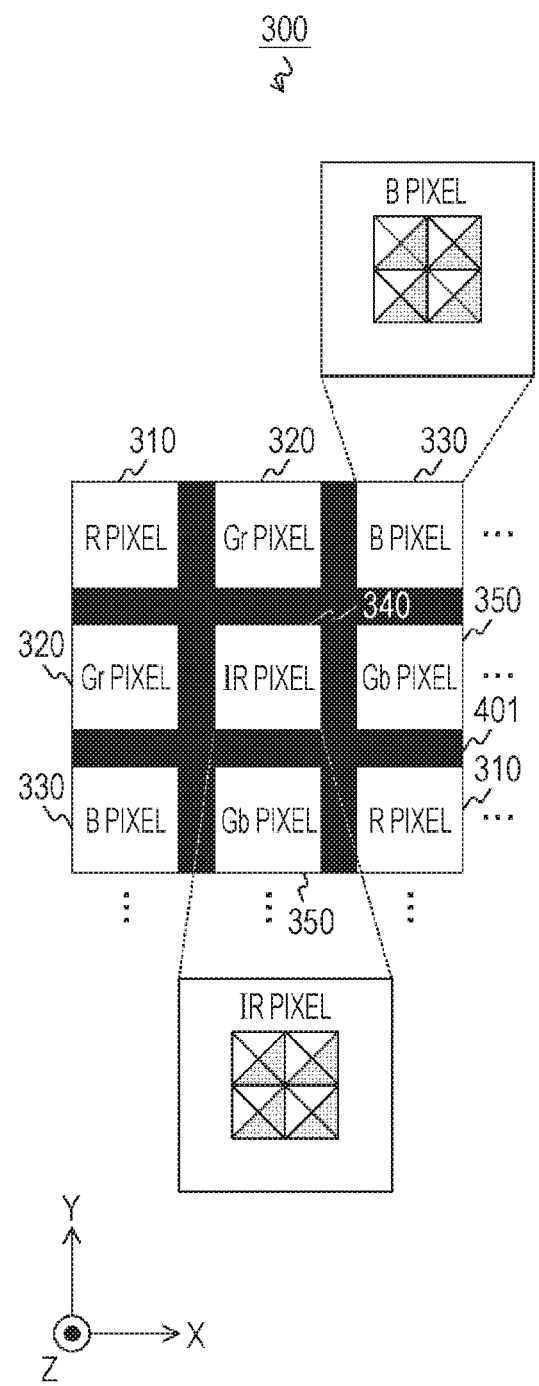
FIG. 34 is an exemplary top view of a pixel array unit according to a first modification of the second embodiment of the present technology.

FIG. 34 is an exemplary top view of the pixel array unit 300 according to the first modification of the second embodiment. The pixel array unit 300 according to the first modification, is different from that according to the first embodiment in that the moth-eye structure is formed only in a partial region at the center on the light-receiving surface of each of an IR pixel 340 and visible-light pixels.

In this manner, according to the first modification of the second embodiment of the present technology, the plurality of protrusions is formed in the partial region of each pixel, and thus the manufacturing device does not need to trim part of the protrusions. This arrangement can inhibit a defect from occurring.

[Second Modification]

According to the first modification of the second embodiment, the manufacturing device forms the moth-eye structure at part of the center of a pixel. However, formation of the moth-eye structure over the entire surface of the pixel improves the sensitivity more than the formation at the part. Note that, if the protrusions are astride the boundary between the pixel and the pixel separation region, as described above, there is a risk that a defect may occur because the manufacturing device trims part of the protrusions in forming the trench. A solid-state image pickup element 200 according to a second modification of the second embodiment, is different from that according to the second embodiment in that a moth-eye structure is formed on the entire surface of a pixel such that the protrusions are not astride the boundary between the pixel and a pixel separation region.

Figure 35:
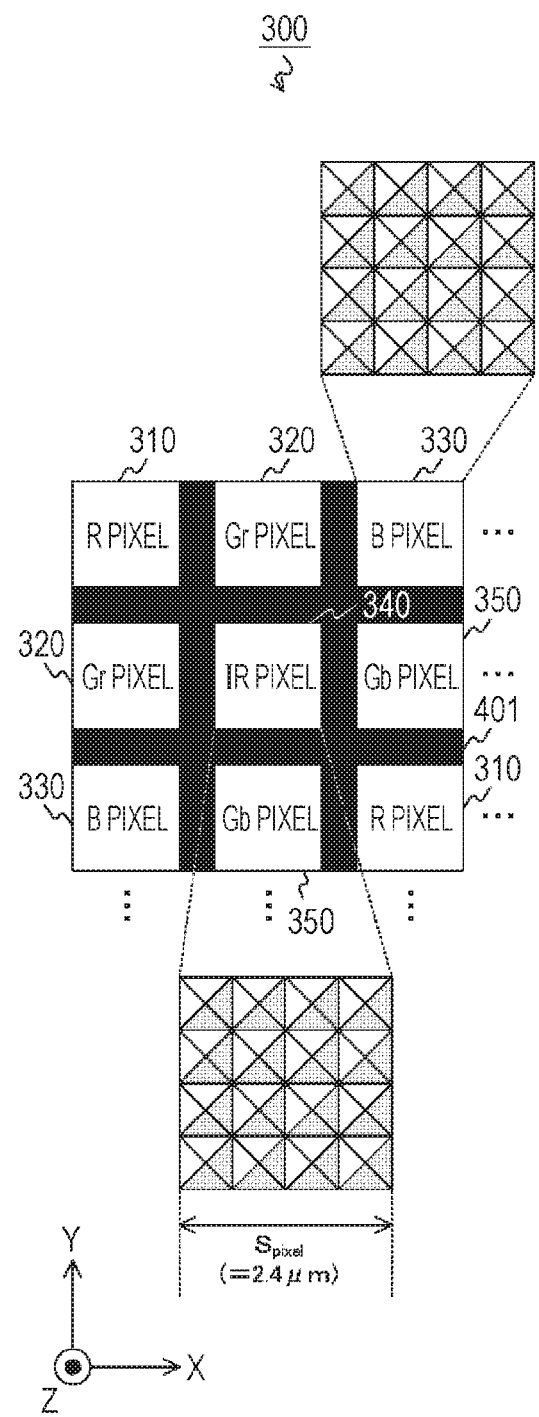
FIG. 35 is an exemplary top view of a pixel array unit according to a second modification of the second embodiment of the present technology.

FIG. 35 is an exemplary top view of a pixel array unit 300 according to a second modification of the second embodiment. The pixel array unit 300 according to the second modification, is different from that according to the second embodiment in that a plurality of protrusions is formed on the basis of an inter-protrusion pitch substantially identical to a divisor of a pixel in size in the X direction or in the Y direction. For example, in a case where the size Spixel of one side of a pixel is 2400 nanometers (nm), the inter-protrusion pitch is set to 480 nanometers. This arrangement prevents the protrusions from being astride the boundary between the pixel and the pixel separation region, and thus there is no risk that a defect may occur in forming a trench.

Note that, for the first embodiment in which the moth-eye structure is formed to only the IR pixels 340, similarly, a plurality of protrusions may be formed on the basis of an inter-protrusion pitch substantially identical to a divisor of the pixels in size.

In this manner, according to the second modification of the second embodiment of the present technology, the inter-protrusion pitch is substantially identical to a divisor of a pixel in size in a predetermined direction, so that the protrusions are not astride the region between the pixel and the pixel separation region. This arrangement has no risk that a defect may occur when the manufacturing device forms the trench.

[Third Modification]

According to the second modification, the respective inter-protrusion pitches of the pixels are the same. Here, as described above, a larger inter-protrusion pitch facilitates acquisition of a reflectance reduction effect. Note that, according to Expression 1 and Expression 2, a shorter wavelength of incident light causes a larger angle of diffraction, and thus it is highly likely that color mixture occurs under a condition in which the inter-protrusion pitches are the same as each other. Thus, a small inter-protrusion pitch is required for a short wavelength because of the increase in the angle of diffraction. Therefore, the value of an optimum inter-protrusion pitch for acquiring the reflectance reduction effect and hardly causing the color mixture, depends on the wavelength of incident light on a pixel. Thus, the inter-protrusion pitch is desirably set in accordance with the wavelength of incident light. A solid-state image pickup element 200 according to a third modification of the second embodiment is different from that according to the second embodiment in that a plurality of protrusions is formed on the basis of an inter-protrusion pitch corresponding to the wavelength of incident light.

Figure 36:
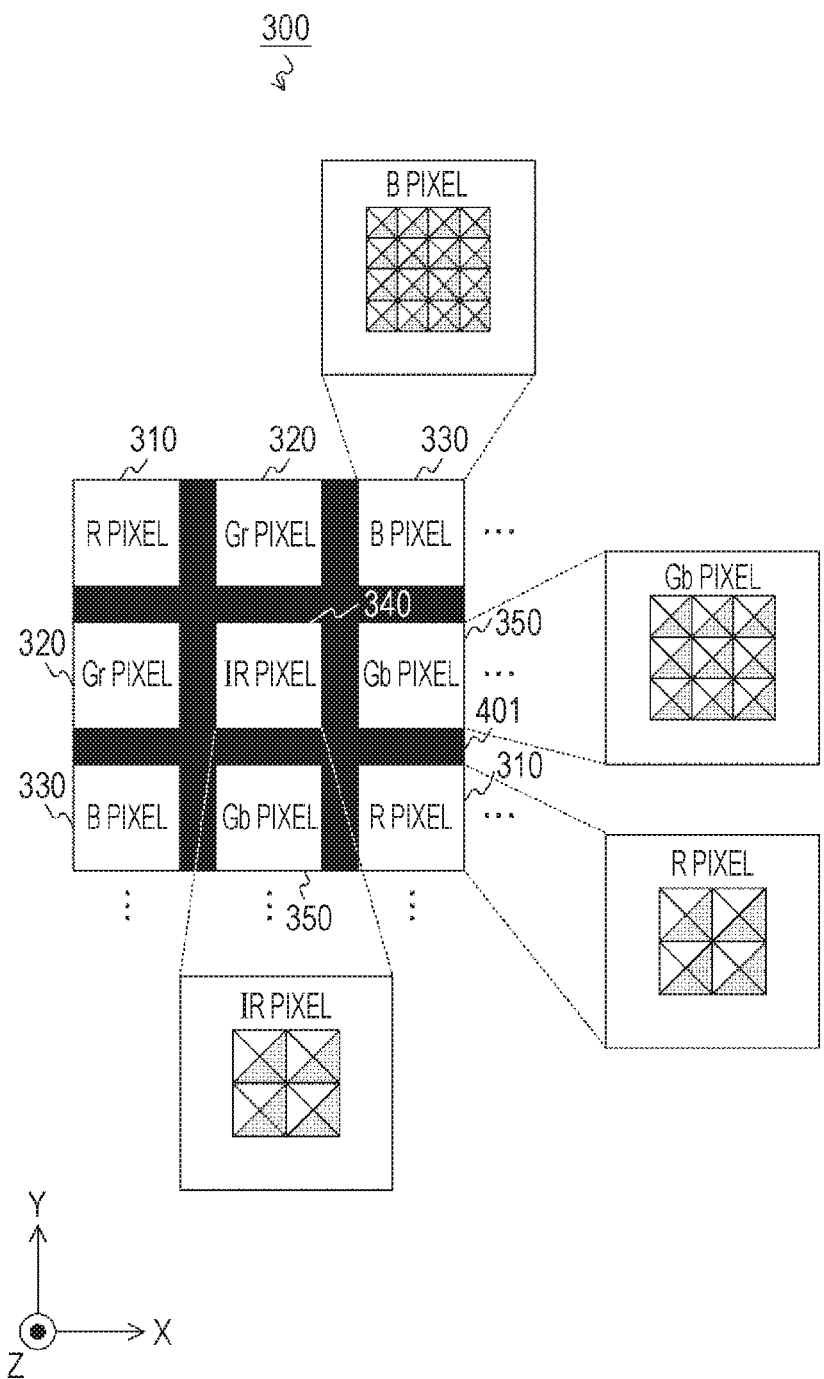
FIG. 36 is an exemplary top view of a pixel array unit according to a third modification of the second embodiment of the present technology.

FIG. 36 is an exemplary top view of a pixel array unit 300 according to the third modification of the second embodiment. The pixel array unit 300 according to the third modification is different from that according to the second embodiment in that the inter-protrusion pitch of a pixel is small as the wavelength of incident light on the pixel is short. Specifically, the wavelength of a B pixel 330 is short, and then a G pixel 320 or 350, an R pixel 310, and an IR pixel 340 are in order of increasing wavelength. Thus, moth-eye structures are formed such that the inter-protrusion pitch of the B pixel 330 is the shortest and the G pixel 320 or 350, the R pixel 310, and the IR pixel 340 are in order of increasing inter-protrusion pitch.

In this manner, according to the third modification of the second embodiment of the present technology, the plurality of protrusions based on the inter-protrusion pitch corresponding to the wavelength of incident light is formed to each pixel, and thus the color mixture is less likely to occur than a case where the respective inter-protrusion pitches of the pixels are the same.

[Fourth Modification]

According to the second embodiment, the IR pixels 340 and the visible-light pixels both are provided to the solid-state image pickup element 200. However, optical filters are required to be separately provided to the IR pixels 340 and the visible-light pixels, and thus the manufacturing process increases in comparison to a case where only IR pixels are provided. Thus, from the viewpoint of facilitation of manufacturing, only IR pixels may be provided and then moth-eye structures and a trench may be formed. A solid-state image pickup element 200 according to a fourth modification of the second embodiment, is different from that according to the second embodiment in that only IR pixels are provided and moth-eye structures and a trench are formed.

Figure 37:
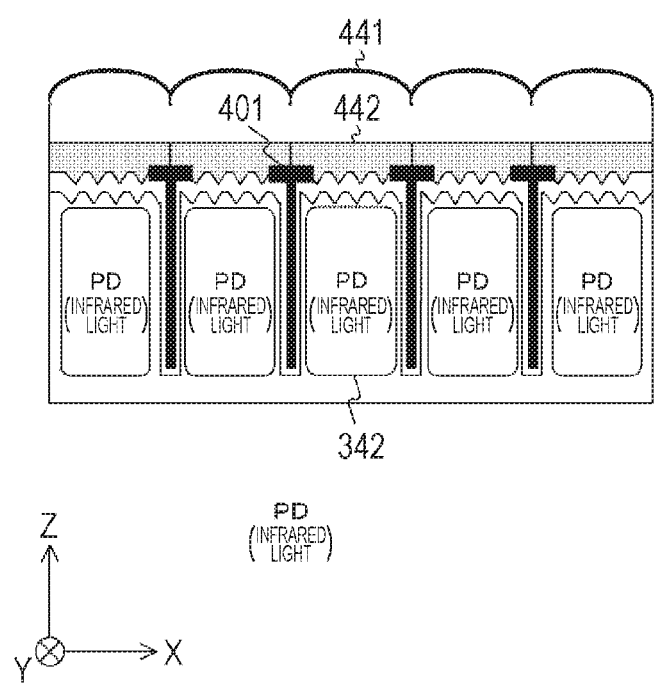
FIG. 37 is an exemplary schematic sectional view of the structure of a pixel array unit according to a fourth modification of the second embodiment of the present technology.

FIG. 37 is an exemplary schematic sectional view of the structure of the pixel array unit 300 according to the fourth modification of the second embodiment. The pixel array unit 300 according to the fourth modification, is different from that according to the second embodiment in that no visible-light pixels are provided and only the IR pixels 340 are provided. The respective light-receiving surfaces of the IR pixels 340 have the moth-eye structures, and the trench is provided therearound, including metal 401 buried.

In this manner, according to the fourth modification of the second embodiment of the present technology, the provision of only the IR pixels 340, formation of a plurality of protrusions on each light-receiving surface, and the burying of the metal in the surrounding trench enable the reflectance on each light-receiving surface to be reduced and the metal to absorb light leaking from each pixel. In addition, according to the fourth modification of the second embodiment, there is no need to provide color filters for visible-light pixels because no visible-light pixels are provided, so that the manufacturing is facilitated in comparison to that according to the second embodiment in which the visible-light pixels are provided.

[Fifth Modification]

According to the second embodiment, the metal 401 is buried in the trench around each pixel (e.g., R pixel 310), but a member different from the metal 401 (e.g., oxide film 412) can be buried in the trench. A solid-state image pickup element 200 according to a fifth modification of the second embodiment is different from that according to the second embodiment in that an oxide film 412 is buried in a trench.

Figure 38:
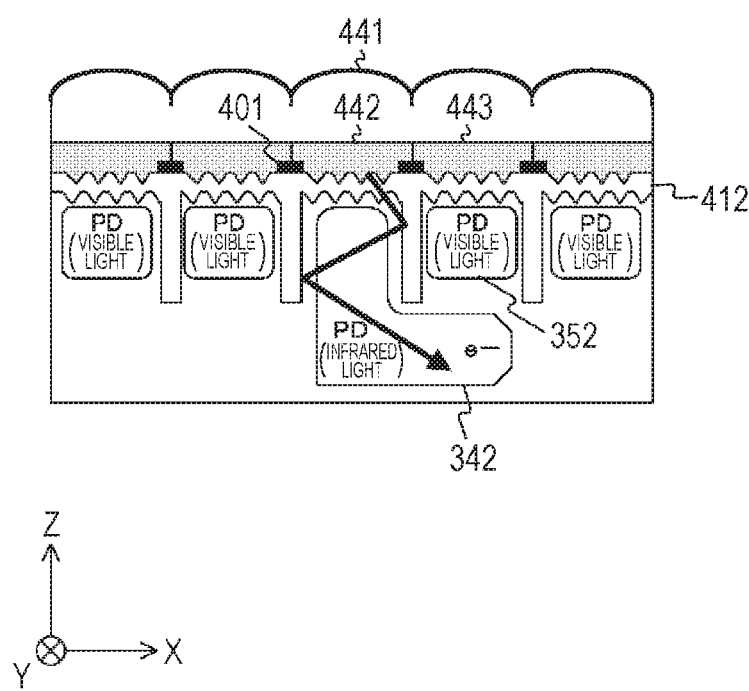
FIG. 38 is an exemplary schematic sectional view of the structure of a pixel array unit according to a fifth modification of the second embodiment of the present technology.

FIG. 38 is an exemplary schematic sectional view of the structure of a pixel array unit 300 according to the fifth modification of the second embodiment. The pixel array unit 300 according to the fifth modification, is different from that according to the first embodiment in that the oxide film 412 is buried in the trench 403. As described above, the oxide film 412 is lower in refractive index than silicon, and thus light leaking from an IR pixel 340 is reflected according to the Fresnel Equations, so that color mixture can be prevented. In addition, metal 401 is arranged on the upper portion of a pixel separation region 402, without being buried in the trench 403.

3. Third Embodiment

According to the first embodiment, no IR cut-off filter is provided, but because the optical filters that transmit visible light transmit slight infrared light in addition to the visible light, there is a risk that the infrared light may be incident on the visible-light pixels to degrade image quality. A solid-state image pickup element 200 according to a third embodiment, is different from that according to the first embodiment in that infrared light toward a visible-light pixel is interrupted.

Figure 39:
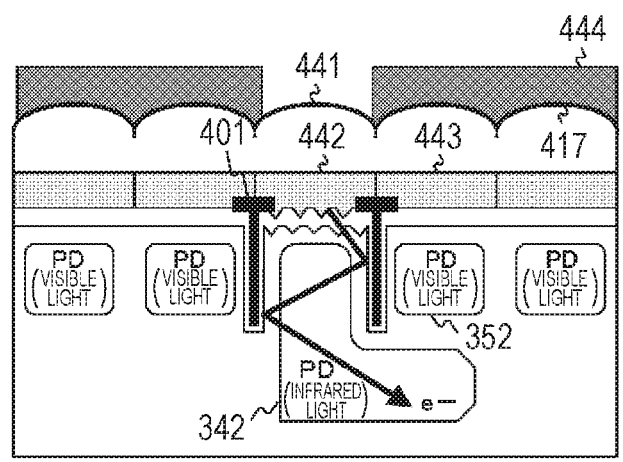
FIG. 39 is an exemplary schematic sectional view of the structure of a pixel array unit according to a third embodiment of the present technology.

FIG. 39 is an exemplary schematic sectional view of the structure of a pixel array unit 300 according to the third embodiment. The pixel array unit 300 according to the third embodiment, further includes an IR cut-off filter 444, differently from that according to the first embodiment.

The IR cut-off filter 444 interrupts infrared light toward visible-light pixels. The IR cut-off filter 444 is provided on the upper portion of an on-chip lens 441. Note that, the IR cut-off filter 444 has an opening at a portion corresponding to an IR pixel 340, and interrupts only the infrared light toward the visible-light pixels.

In this manner, according to the third embodiment of the present technology, the provision of the IR cut-off filter 444 having the opening at the portion corresponding to the IR pixel 340, can interrupt incidence of the infrared light on the visible-light pixels. This arrangement can improve the image quality of image data.

[Modification]

According to the third embodiment, the IR cut-off filter 444 having the opening at the portion corresponding to the IR pixel 340 is provided, but there is a risk that the infrared light from the opening portion may be incident on a visible-light pixel. A solid-state image pickup element 200 according to a first modification of the third embodiment, is different from that according to the third embodiment in that an IR cut-off filter having no opening portion is inserted.

Figure 40:
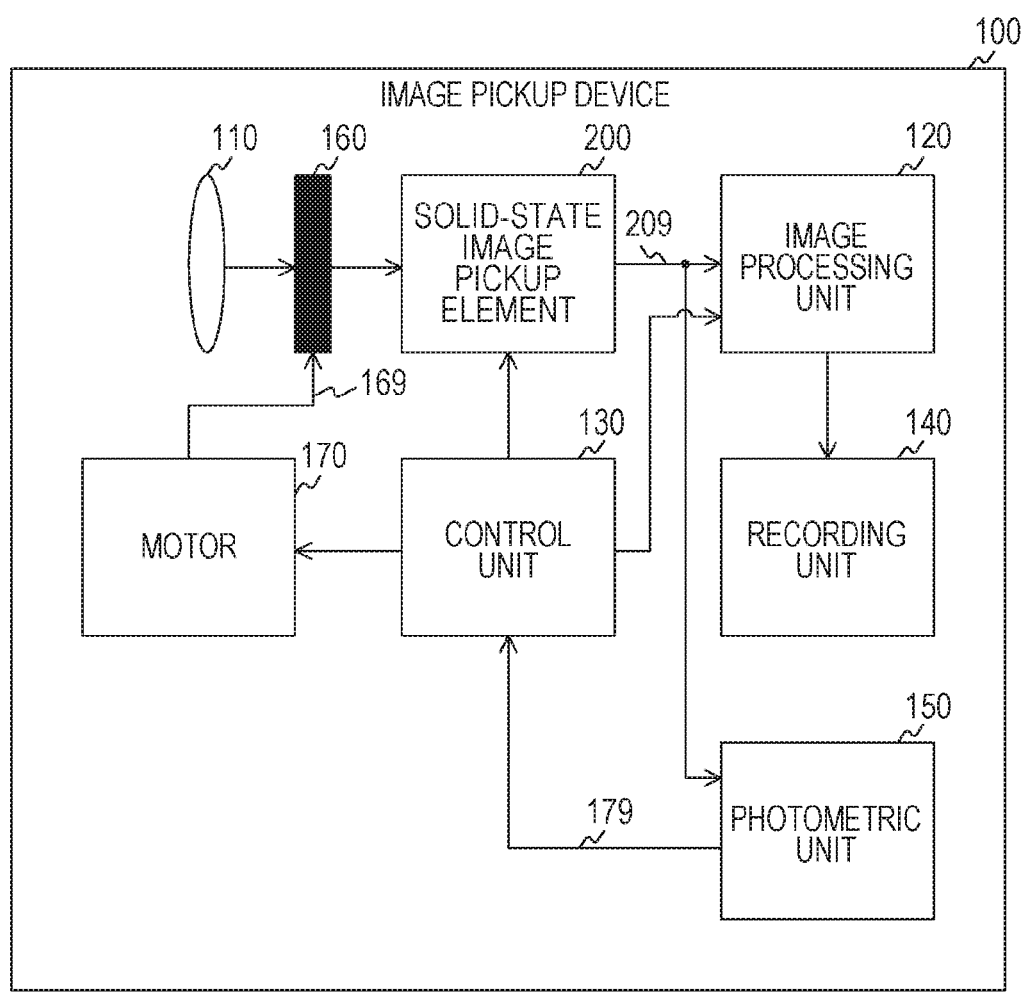
FIG. 40 is a block diagram of an exemplary configuration of an image pickup device according to a modification of the third embodiment of the present technology.

FIG. 40 is a block diagram of an exemplary configuration of an image pickup device 100 according to the modification of the third embodiment. The image pickup device 100 according to the modification of the third embodiment, further includes the IR cut-off filter 160 and a motor 170, differently from that according to the third embodiment. In addition, the solid-state image pickup element 200 according to the modification of the third embodiment, includes no IR cut-off filter 444, differently from that according to the third embodiment.

The IR cut-off filter 160 interrupts infrared light. The IR cut-off filter 160 has no opening at a portion corresponding to a visible-light pixel. The motor 170 inserts the IR cut-off filter 160 into a predetermined position between an image pickup lens 110 and the solid-state image pickup element 200 or removes the IR cut-off filter 160 from the position, in accordance with the control of a control unit 130. Note that, the IR cut-off filter 160 is an exemplary infrared-light interrupting filter described in the claims. In addition, the motor 170 is an exemplary insertion and removal unit described in the claims.

On the basis of a photometric amount, the control unit 130 according to the modification of the third embodiment, controls the motor 170 to perform the insertion or removal of the IR cut-off filter 160. For example, the control unit 130 causes the IR cut-off filter 160 to be removed in a case where the photometric amount is a threshold value or less. Otherwise, the control unit 130 causes the IR cut-off filter 160 to be inserted. Note that, the control unit 130 may control the motor 170 on the basis of information different from the photometric amount. For example, the control unit 130 removes the IR cut-off filter 160 on the basis of time information indicating a time zone, such as night time, and inserts the IR cut-off filter 160 on the basis of the time information indicating the time zone of day time. Alternatively, the control unit 130 controls the motor 170 on the basis of an operation signal.

Figure 41:
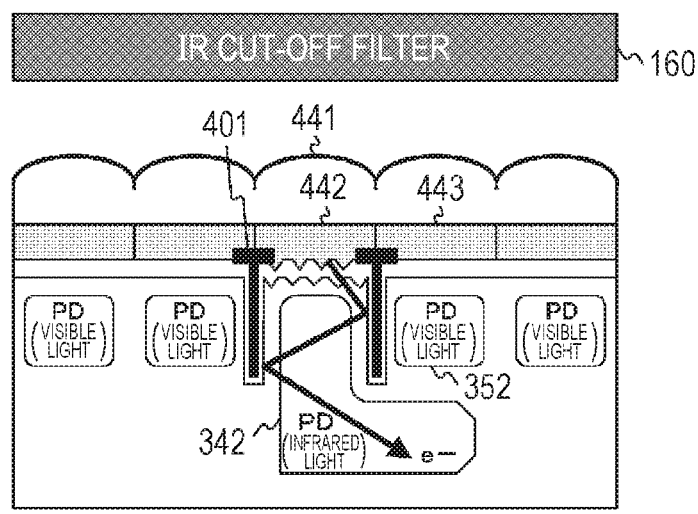
FIG. 41 is an exemplary sectional view of an IR cut-off filter and a pixel array unit according to the modification of the third embodiment of the present technology.
Figure 41:
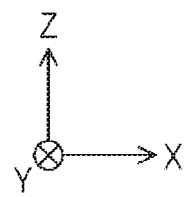

FIG. 41 is an exemplary sectional view of the IR cut-off filter 160 and a pixel array unit 300 according to the modification of the third embodiment. As illustrated in the figure, because the IR cut-off filter 160 has no opening at a portion corresponding to an IR pixel 340, no infrared light is incident on visible-light pixels. Thus, the image quality of image data can be improved in comparison to that according to the third embodiment.

In this manner, according to the modification of the third embodiment of the present technology, the insertion or removal of the IR cut-off filter 160 having no opening portion can interrupt the infrared light toward the visible-light pixels. This arrangement can improve the quality of image data generated from pixel signals of the visible-light pixels.

4. Fourth Embodiment

According to the first embodiment, the trench is formed only on the light-receiving surface (back), but a trench can be further formed on the front opposed to the back. A solid-state image pickup element 200 according to a fourth embodiment, is different from that according to the first embodiment in that a trench is further formed on the front side.

Figure 42:
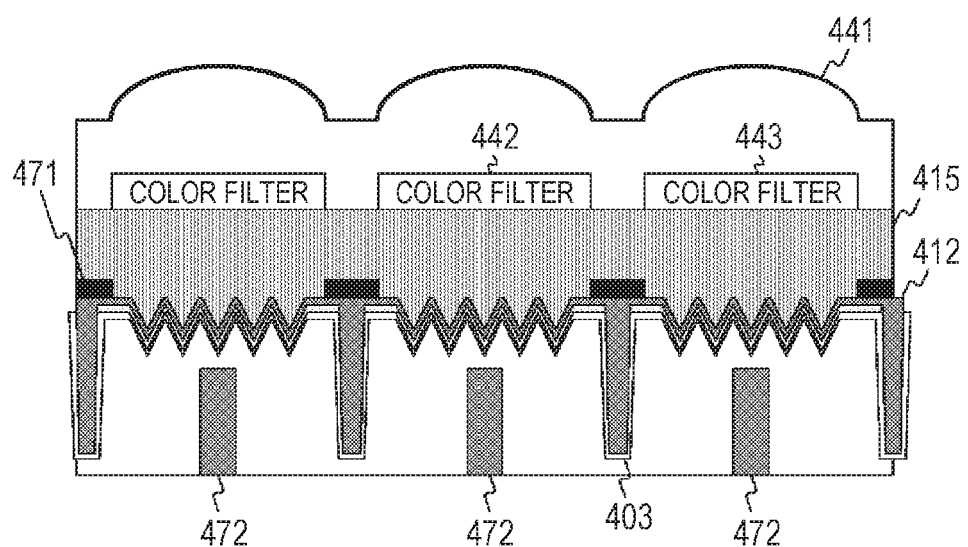
FIG. 42 is an exemplary schematic sectional view of the structure of a pixel array unit according to a fourth embodiment of the present technology.

FIG. 42 is an exemplary schematic sectional view of the structure of a pixel array unit 300 according to the fourth embodiment of the present technology. The pixel array unit 300 according to the fourth embodiment, is different from that according to the first embodiment in that the trench 472 is formed on the front side. The trench 472 is formed in the vicinity of the center portion of each pixel at the front. In addition, the trench 472 has an oxide film buried, similarly to a trench 403 on the back side. In addition, the upper portion of the trench 403 is provided with a planarization film 471. Note that, the trench 472 is an exemplary opposed-surface-sided trench described in the claims. In addition, the oxide film in the trench 472 is an exemplary opposed-surface-sided member described in the claims.

In addition, the pixel array unit 300 according to the fourth embodiment, is different from that according to the first embodiment in that a moth-eye structure is formed to a visible-light pixel in addition to an IR pixel and the trench 403 is formed around the visible-light pixel at the back. In addition, the photodiode of the IR pixel has no expansion to the IR pixel side, differently from that according to the first embodiment. Furthermore, only the oxide films are buried in the trenches 403 and 452 provided with no metal, differently from the first embodiment.

As described above, the provision of the trench 472 on the front side allows light to be reflected and scattered on the trench 472, in addition to light scattering on the asperities of the moth-eye structure, so that the optical path is longer than that in a case where no trench 472 is provided. This arrangement can improve the sensitivity of the pixel.

Note that, the trench 472 may be formed on the front side in each of the pixel array units 300 according to the first, second, and third embodiments, and the modifications thereof, similarly to the fourth embodiment. Note that, in a case where the trench 472 is provided in the sixth modification (front-illuminated type) of the first embodiment, the trench 472 is provided at the back because the light-receiving surface is at the front.

Figure 43:
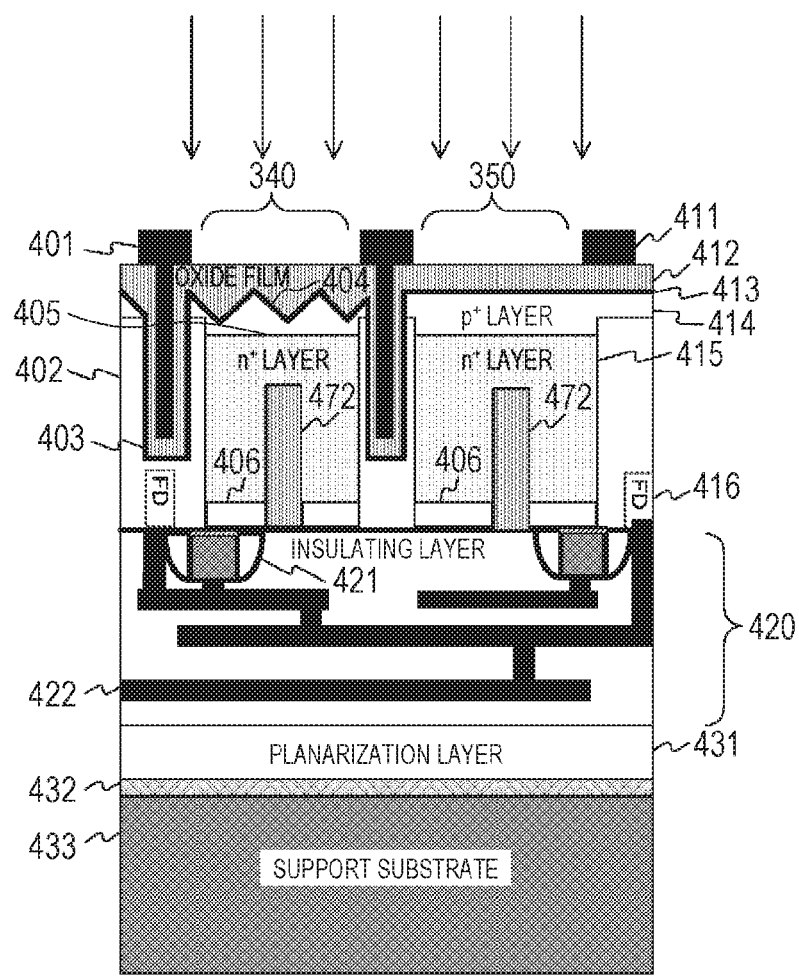
FIG. 43 is an exemplary sectional view of the pixel array unit with a photodiode unexpanded according to the fourth embodiment of the present technology.

FIG. 43 is an exemplary sectional view of the structure of the pixel array unit 300 according to the fourth embodiment. At the surface on the insulating layer 420 side of a substrate having the pixels provided, namely, at the front, the trench 472 is formed in the center portion of each pixel. The depth of the trench 472 when viewed from the front, is shorter than the distance between the front and the back.

Figure 44:
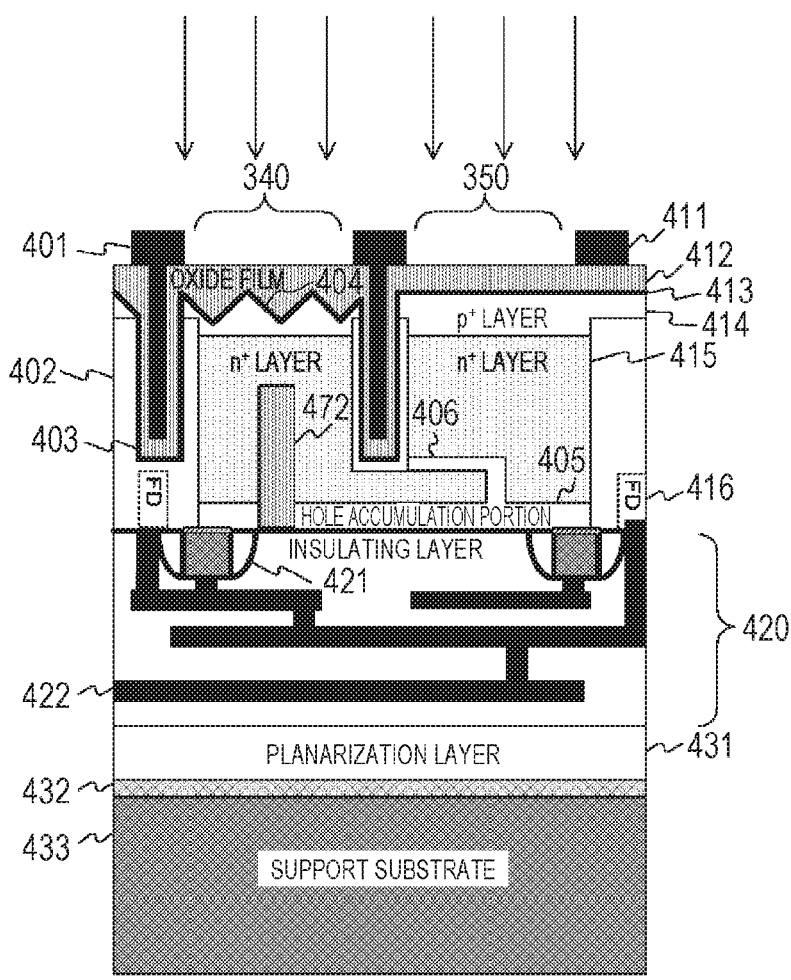
FIG. 44 is an exemplary sectional view of the pixel array unit with the photodiode expanded according to the fourth embodiment of the present technology.

Note that, FIG. 43 illustrates that the photodiode of an infrared-light pixel does not expand, but the photodiode may not expand. FIG. 44 is an exemplary sectional view of the structure of the pixel array unit 300 according to the fourth embodiment, with the photodiode of the infrared-light pixel expanding. In this case, at the surface on the insulating layer 420 side of the substrate having the infrared-light pixel provided, namely, at the front, the trench 472 is formed only at the center portion of the pixel. The depth of the trench 472 when viewed from the front, is shorter than the distance between the front and the back.

Figure 45:
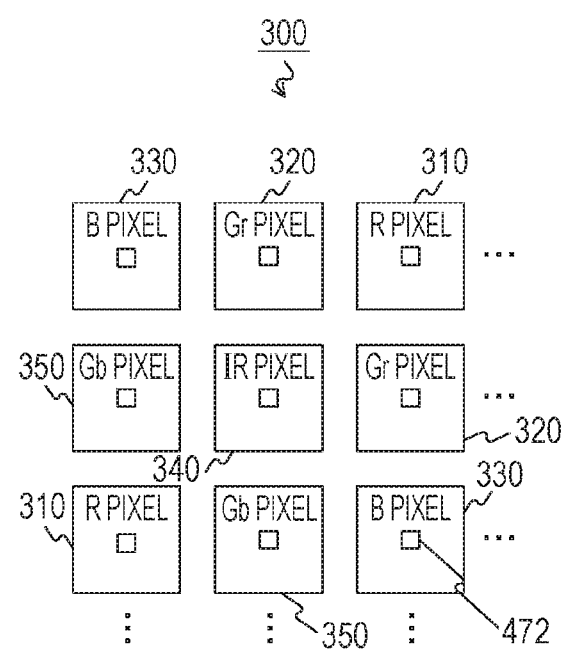
FIG. 45 is an exemplary bottom view of the pixel array unit according to the fourth embodiment of the present technology.

FIG. 45 is an exemplary bottom view of the pixel array unit 300 according to the fourth embodiment. The figure illustrates the pixel array unit 300 when viewed from the bottom being the front of the substrate. The trench 472 is provided as an island at the center portion of each pixel.

Figure 46:
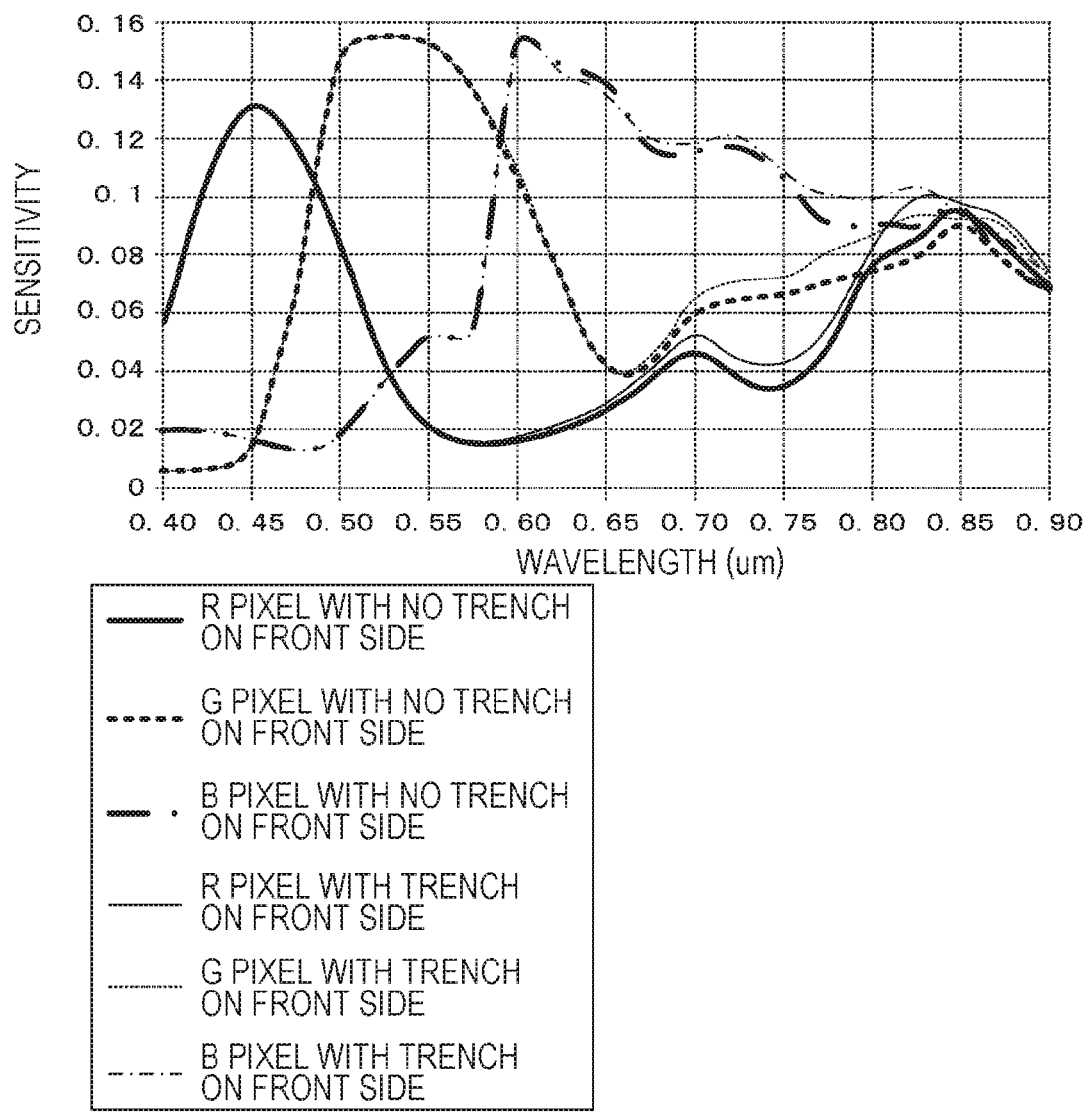
FIG. 46 is a graph of an exemplary relationship between the sensitivity of each pixel and wavelength according to the fourth embodiment of the present technology.

FIG. 46 is a graph of an exemplary relationship between the sensitivity of each pixel and wavelength according to the fourth embodiment. In the figure, the vertical axis represents the sensitivity of each pixel, and the horizontal axis represents the wavelength of light incident on each pixel. In addition, a bold solid line indicates the sensitivity of an R pixel having no trench 472 on the front side as a function of wavelength, and a thin solid line indicates the sensitivity of an R pixel having the trench 472 on the front side as a function of wavelength. A bold dotted line indicates the sensitivity of a G pixel having no trench 472 on the front side as a function of wavelength, and a thin dotted line indicates the sensitivity of a G pixel having the trench 472 on the front side as a function of wavelength. A bold dot-and-dash line indicates the sensitivity of a B pixel having no trench 472 on the front side as a function of wavelength, and a thin dot-and-dash line indicates the sensitivity of a B pixel having the trench 472 on the front side as a function of wavelength. As illustrated in the figure, the provision of the trench 472 on the front side, improves the sensitivity of each pixel. For example, the sensitivity improves by approximately five percent (%).

In this manner, according to the fourth embodiment of the present technology, the provision of the trench 472 on the front side and the burying of the oxide film, allows the light to be reflected and scattered on the trench 472, so that the sensitivity of each pixel can be further improved.

Note that the embodiments described above are exemplified in order to embody the present technology, and the matters in the embodiments and particular matters concerning the invention in the claims are in correspondence relationship with each other. Similarly, the particular matters concerning the invention in the claims correspond to the matters in the embodiments of the present technology denoted with the same names as the particular matters. Note that the present technology is not limited to the embodiments, and thus various modifications are made to the embodiments without departing from the scope of the spirit so that the present technology can be embodied.

Note that, the effects described here are not necessarily limited, and any of the effects described in the present disclosure may be provided.

Note that the present technology can also have the following configurations.

(1)

A solid-state image pickup element including:

a pixel having a plurality of protrusions formed on a light-receiving surface;

a light-receiving-surface-sided trench being a trench formed around the pixel at the light-receiving surface; and a light-receiving-surface-sided member buried in the light-receiving-surface-sided trench.

(2)

The solid-state image pickup element described in (1) above, in which an interval between respective representative points of the plurality of protrusions, is 250 nanometers or more.

(3)

The solid-state image pickup element described in (1) or (2) above, in which an interval between respective representative points of the plurality of protrusions is substantially identical to a divisor of the pixel in size in a predetermined direction parallel to the light-receiving surface.

(4)

The solid-state image pickup element described in (1) or (2) above, in which the plurality of protrusions is formed in a partial region of the pixel at the light-receiving surface.

(5)

The solid-state image pickup element described in any of (1) to (4) above, according to the solid-state image pickup element described in any of (1) to (4) above, in which the light-receiving-surface-sided trench is two micrometers or more in depth.

(6))

The solid-state image pickup element described in any of (1) to (5) above, in which the light-receiving-surface-sided member includes a member lower in refractive index than the pixel.

(7)

The solid-state image pickup element described in any of (1) to (6) above, in which the light-receiving-surface-sided member includes metal.

(8)

The solid-state image pickup element described in any of (1) to (7) above, in which the pixel includes: an infrared-light pixel configured to receive infrared light; and a visible-light pixel configured to receive visible light.

(9)

The solid-state image pickup element described in (8) above, in which the plurality of protrusions is formed at the infrared-light pixel.

(10)

The solid-state image pickup element described in (8) above, in which the plurality of protrusions is formed at both of the infrared-light pixel and the visible-light pixel.

(11)

The solid-state image pickup element described in any of (8) to (10) above, further including:

an infrared-light interrupting filter configured to interrupt the infrared light from the visible light and the infrared light, the infrared-light interrupting filter being arranged between the visible-light pixel and an image pickup lens.

(12)

The solid-state image pickup element described in any of (8) to (11) above, in which the infrared-light pixel includes a first photoelectric conversion portion configured to photoelectrically convert the infrared light, the visible-light pixel includes a second photoelectric conversion portion configured to photoelectrically convert the visible light, and the first photoelectric conversion portion expands beneath the second photoelectric conversion portion with a direction toward an image pickup lens regarded as being upward.

(13)

The solid-state image pickup element described in any of (8) to (12) above, in which the infrared-light pixel includes a photoelectric conversion portion configured to photoelectrically convert the light, and the light-receiving-surface-sided trench is smaller in depth than the photoelectric conversion portion of the infrared-light pixel.

(14)

The solid-state image pickup element described in any of (1) to (13) above, in which a plurality of the pixels is provided, the plurality of pixels each receive light having an individual different wavelength, and the plurality of pixels each include a photoelectric conversion portion having a depth corresponding to the wavelength of the light.

(15)

The solid-state image pickup element described in any of (1) to (14) above, in which a plurality of the pixels is provided, the plurality of pixels each receive light having an individual different wavelength, and an interval between respective representative points of the plurality of protrusions, has a value corresponding to the wavelength of the light to be received by the pixel provided with the plurality of protrusions.

(16)

The solid-state image pickup element described in any of (1) to (15) above, further including:

an opposed-surface-sided trench formed at an opposed surface opposed to the light-receiving surface of a substrate having the pixel formed; and an opposed-surface-sided member buried in the opposed-surface-sided trench.

(17)

The solid-state image pickup element described in (16) above, in which the opposed-surface-sided member includes a member lower in refractive index than the pixel.

(18)

An image pickup device including:

a solid-state image pickup element including: a pixel having a plurality of protrusions on a light-receiving surface; a light-receiving-surface-sided trench being a trench formed around the pixel at the light-receiving surface; and a light-receiving-surface-sided member buried in the light-receiving-surface-sided trench; and an image pickup lens configured to guide light to the solid-state image pickup element.

(19)

The image pickup device described in (18) above, further including:

an infrared-light interrupting filter configured to interrupt infrared light; and an insertion and removal unit configured to perform insertion of the infrared-light interrupting filter into a predetermined position between the image pickup lens and the solid-state image pickup element or removal of the infrared-light interrupting filter from the predetermined position, in which the pixel includes: an infrared-light pixel configured to receive the infrared light; and a visible-light pixel configured to receive visible light.

(20)

The image pickup device described in (18) or (19) above, in which the solid-state image pickup element further includes a signal processing unit configured to process a pixel signal from the pixel.

(21)

A method of manufacturing a solid-state image pickup element, the method including:

a pixel formation process of forming a pixel at a substrate;

a protrusion formation process of forming a plurality of protrusions at a light-receiving surface of the pixel;

a trench formation process of forming, as a light-receiving-surface-sided trench, a trench around the pixel at the light-receiving surface; and a burying process of burying a light-receiving-surface-sided member in the light-receiving-surface-sided trench.

(22)

The manufacturing method described in (21) above, in which the plurality of protrusions is formed by wet etching.

REFERENCE SIGNS LIST

100 Image pickup device
110 Image pickup lens
120 Image processing unit
130 Control unit
140 Recording unit
150 Photometric unit
160 IR cut-off filter
170 Motor
200 Solid-state image pickup element
210 Vertical driving circuit
220 Control circuit
230 Column signal processing unit
231 Signal processing circuit
240 Horizontal driving circuit
50 Output circuit
300 Pixel array unit
310 R pixel
320 Gr pixel
321, 331, 341, 351, 421, 508 Transfer transistor
322, 332, 342, 352 Photodiode
330 B pixel
340 IR pixel
350 Gb pixel
360 Transistor formation region
361 Reset transistor
362 Amplification transistor
363 Selection transistor
370, 416, 506 Floating diffusion layer 401, 411, 504, 473 Metal
402 Pixel separation region
403, 472, 503 Trench
404, 414, 505, 507 p+ layer
405, 415, 501, 502 n+ layer
406 Hole accumulation portion
412 Oxide film
413 Fixed charged membrane
420, 509 Insulating layer
422 Wiring
431 Planarization layer
432 Adhesion layer
433 Support substrate
441 On-chip lens
442 IR transmissive filter
443 Color filter
444 IR cut-off filter
450 SOI substrate
457 Gate
458 Side wall
461, 462, 463, 464, 465 Mask
471 Planarization film

What is claimed is:

1. An infrared light detecting device, comprising:
a semiconductor substrate, wherein the semiconductor substrate includes:
   a first surface as a light-receiving surface;
   a second surface opposite to the first surface;
   a plurality of photoelectric conversion regions, wherein the plurality of the photoelectric conversion regions comprises:
      a first photoelectric conversion region; and
      a second photoelectric conversion region adjacent to the first photoelectric conversion region;
   a plurality of optical filters on the first surface of the semiconductor substrate, wherein
      a first optical filter of the plurality of optical filters is on the first photoelectric conversion region,
      a second optical filter of the plurality of optical filters is on the second photoelectric conversion region, and
      the first optical filter is adjacent to the second optical filter;
   a first trench on the second surface, wherein the first trench is in the first photoelectric conversion region;
   a plurality of light shielding elements, wherein
      a first light shielding element of the plurality of light shielding elements is between the first photoelectric conversion region and the second photoelectric conversion region,
      a portion of the first light shielding element is inside each of the first optical filter and the second optical filter adjacent to the first optical filter, and
      the portion of the first light shielding element overlaps each of the first optical filter and the second optical filter in a light receiving direction of the infrared light detecting device; and
   a moth-eye structure on the first surface of the semiconductor substrate.

2. The infrared light detecting device according to claim 1, wherein the first photoelectric conversion region is a near-infrared-light pixel configured to receive infrared light.

3. The infrared light detecting device according to claim 2, further comprising a pixel separation region that separates the near-infrared-light pixel from a visible-light pixel.

4. The infrared light detecting device according to claim 1, wherein the second photoelectric conversion region is a visible-light pixel configured to receive visible light.

5. The infrared light detecting device according to claim 4, wherein the visible-light pixel includes one of a red pixel, a green pixel, or a blue pixel.

6. The infrared light detecting device according to claim 1, wherein an interval between a center of the first photoelectric conversion region and a center of the second photoelectric conversion region is a pixel pitch.

7. The infrared light detecting device according to claim 1, wherein
the moth-eye structure has a plurality of protrusions, and
each protrusion of the plurality of protrusions has a specific shape.

8. The infrared light detecting device according to claim 7, wherein
an interval between an apex of a first protrusion of the plurality of protrusions and an apex of a second protrusion of the plurality of protrusions is an inter-protrusion pitch, and
the second protrusion is adjacent to the first protrusion.

9. The infrared light detecting device according to claim 8, wherein the inter-protrusion pitch is less than a wavelength of infrared light incident on one of the first photoelectric conversion region or the second photoelectric conversion region.

10. The infrared light detecting device according to claim 8, wherein the inter-protrusion pitch is less than 800 nanometers.

11. The infrared light detecting device according to claim 8, wherein the second photoelectric conversion region has a flat structure.

12. The infrared light detecting device according to claim 1, wherein the first photoelectric conversion region includes the moth-eye structure configured to reduce reflectance on the first photoelectric conversion region.

13. The infrared light detecting device according to claim 1, wherein the first light shielding element has a second trench with a specific depth.

14. The infrared light detecting device according to claim 13, wherein
the second trench includes metal, and
the second trench absorbs infrared light.

15. The infrared light detecting device according to claim 3, wherein the pixel separation region includes a transistor transformation region including a transistor.

* * * * *